United States Patent [19]
Yamamoto

[11] Patent Number: 5,594,670
[45] Date of Patent: Jan. 14, 1997

[54] APPARATUS FOR MEASURING CIRCUIT CONSTANT OF INDUCTION MOTOR WITH VECTOR CONTROL SYSTEM AND METHOD THEREFOR

[75] Inventor: Yasuhiro Yamamoto, Tokyo, Japan

[73] Assignee: Kabushiki Kaisha Meidensha, Tokyo, Japan

[21] Appl. No.: 286,245

[22] Filed: Aug. 8, 1994

[30] Foreign Application Priority Data

Sep. 3, 1993 [JP] Japan .................................... 5-219338
Nov. 25, 1993 [JP] Japan .................................... 5-294848

[51] Int. Cl.$^6$ ................................................. G01R 11/48
[52] U.S. Cl. ...................... 364/571.01; 318/767; 318/805
[58] Field of Search ................................. 187/296, 727, 187/812; 318/727, 767, 798–802, 805, 806; 364/481, 571.01, 578, 579

[56] References Cited

U.S. PATENT DOCUMENTS

| | | | |
|---|---|---|---|
| 4,862,343 | 8/1989 | Nomura et al. | 363/41 |
| 5,136,228 | 8/1992 | Yamada et al. | 318/808 |
| 5,365,158 | 11/1994 | Tanaka et al. | 318/806 |
| 5,396,161 | 3/1995 | Doi et al. | 318/807 |

OTHER PUBLICATIONS

JEC-37$_{-1979}$, Induction Machines, Standard of Japanese Electrotechnical Committee, (Preface), pp. 1–3, Contents, pp. 43–44, with Background of the Invention from original specification and copy of Japanese text, pp. 1, 7, 39 and 40 (1979).

Takayama et al., "Relationship between Vector–Control of Induction Motor Taking Stator Core–Loss into Consideration and Equivalent Circuit", pp. 206–209 I.E.E. Japan, Industrial and Application Department (1992).

Yamada et al., "Compensation for Parameters Variation of Induction Motor Improved Torque Control Characteristics at Low and High Speed Region", vol. 112, No. 2, pp. 107–116 Dengakuron (1992).

Yamamoto et al., "No. 636 Measurement of Induction Motor Constants Using an Inverter", National Convention Record I.E.E. Japan, pp. 1–3 (trans.), with original Japanese text, 2 pages, (1993).

Yamamoto et al., "No. 155 Measurement of Motor Constants Using Inverter", National Convention Record I.E.E., Japan, pp. 1–10 (trans.), with original Japanese text, 3 pages, (1993).

*Primary Examiner*—Emanuel T. Voeltz
*Assistant Examiner*—Craig Steven Miller
*Attorney, Agent, or Firm*—Foley & Lardner

[57] ABSTRACT

An apparatus and method for measuring at least one desired motor constant applicable to an equivalent circuit of the induction motor according to the present invention utilizes a vector controlled speed variable apparatus for the induction motor. After the input and output parameters of the induction motor are measured, the apparatus calculates and measures the desired motor constant using a corresponding equation. For example, the secondary circuit time constant is calculated using the following equation. That is to say, $$\tau_2 \approx \tau_{2q}^* \text{ and } V_{1q}^*(t) = (V_{1q}^*)_{+0} \cdot \exp(-(1/\tau 2q^*) \cdot t)$$

wherein $(V_{1q}^*)_{+0}$ denotes a control q-axis primary voltage component immediately after torqu and excitation current instructions have been changed to zero and output from a current control system (ACR), $V_{1q}^*(t)$ denotes a time function of $V_{1q}^*$ at each sampling period after the current instructions have been changed in the stepwise manner to zero.

11 Claims, 13 Drawing Sheets

ACR OUTPUT PHASE VOLTAGE

APPARATUS FOR MEASURING CIRCUIT CONSTANT OF INDUCTION MOTOR WITH VECTOR CONTROL SYSTEM AND METHOD THEREFOR

BACKGROUND OF THE INVENTION

1. Field of the Invention

The present invention relates to an apparatus for measuring circuit constants of an induction motor using a vector control and a method therefor. The present invention particularly relates to a speed variable apparatus for the induction motor having a current control system (ACR, generally abbreviated for an automatic current regulator) and having a function of measuring motor constants. The motor constants are described in an established equivalent circuit of the induction motor.

2. Description of the Background Art

In a vector control system of a speed variable apparatus for an induction machine such as an induction motor, it becomes necessary to know an actual time constant of a rotor (secondary circuit) in order to calculate a slip frequency of the motor since the vector control is required to control currents and slip to control the slip frequency. In addition, since a secondary circuit resistance $R_2$ tends to vary according to the rotor temperature (ambient temperature inclusive), it becomes necessary to know all of the circuit constants of the motor to compensate for the variation in the secondary circuit resistance $R_2$.

One of previously proposed motor circuit constant measuring methods includes a standard specified by JEC-37-$_{1979}$ (Standard of a Japanese Electrotechnical Committee INDUCTION MACHINES). The JEC 87 describes measurements of a primary (stator) resistance using a DC potential difference drop method, a leakage inductance and secondary circuit (rotor) resistance using a locked rotor test, and an exciting inductance using a no-load test.

It is necessary to provide means for fixing an output axle of the motor thereon in the locked rotor test and often necessary to provide a large sized instrument for its measurement of the leakage inductance.

In addition, since, for its measurement condition, a measured voltage is relatively low so that a measurement with a higher frequency than frequency components generated in the secondary circuit of the motor during an actual driving of the motor is made so as to provide a desired voltage accuracy.

In the locked rotor test of the induction motor formed of a special shape such as a double squirrel-cage type as a secondary conductor, an error occurs due to the influence of a skin effect between values of the leakage inductance measured at a higher frequency than that during the driving of the motor and of that during the actual driving situation.

Hence, in the cases where the measured constants derived through the locked rotor test under the JEC 37 are applied to the vector control system for the induction motor and/or where the highly functional control such as the temperature variation compensation for the secondary resistance in the vector control system is carried out, an error occurs in an output torque of the motor and it becomes difficult to control the motor with a high accuracy.

As described above, since the above-described method of measuring the motor circuit constants under the specification of JEC 37 may accurately not derive the motor constants under actual motor driving situations, in the vector control system, load torque tests are actually carried out so that an operator is manually needed to adjust the motor constants so that results of testing characteristics and transient characteristics accord with ideal characteristics.

SUMMARY OF THE INVENTION

It is an object of the present invention to provide an apparatus and method for measuring circuit constants of an induction motor with a high accuracy and in easiness of deriving the motor circuit constants even in cases of a load device connected to an output axle of the motor and/or of a no-load driving condition so that a highly accurate vector control system of a speed variable apparatus for an induction motor using the measured motor constants can be achieved.

The above-described object can be achieved by providing an apparatus for an induction motor, comprising: a) power inverting means for supplying a desired vector controlled alternating current to said induction motor; b) current control means for controlling the alternating current supplied from said semiconductor power inverting means to said induction motor in a vector control mode; c) detecting means for detecting at least one of output and input parameters of said induction motor which is driven under a predetermined driving condition according to the vector controlled alternating current; and d) calculating means for calculating at least one desired motor constant of said induction motor in a predetermined equivalent circuit thereof on the basis of the detected parameter, said current control means controlling the alternating current in the vector control mode using the calculated motor constant.

The above-described object can also be achieved by providing a method for measuring at least one desired motor constant in an established equivalent circuit of an induction motor using a vector control system, comprising the steps of: a) supplying a desired vector controlled alternating current to said induction motor, the induction motor being driven in a predetermined driving condition; b) controlling the alternating current supplied at said step a) from power inverting means connected to said induction motor and supplied thereto in a vector control mode; c) detecting at least one of output and input parameters of said induction motor which is driven under a predetermined driving condition according to the vector controlled alternating current supplied to said induction motor; and d) calculating the desired motor constant of said induction motor in the established equivalent circuit thereof on the basis of the detected parameter, said step b) controlling the alternating current supplied to said induction motor via said power inverting means in the vector control mode using the calculated motor constant.

BEST MODE CARRYING OUT THE INVENTION

Figure 1:
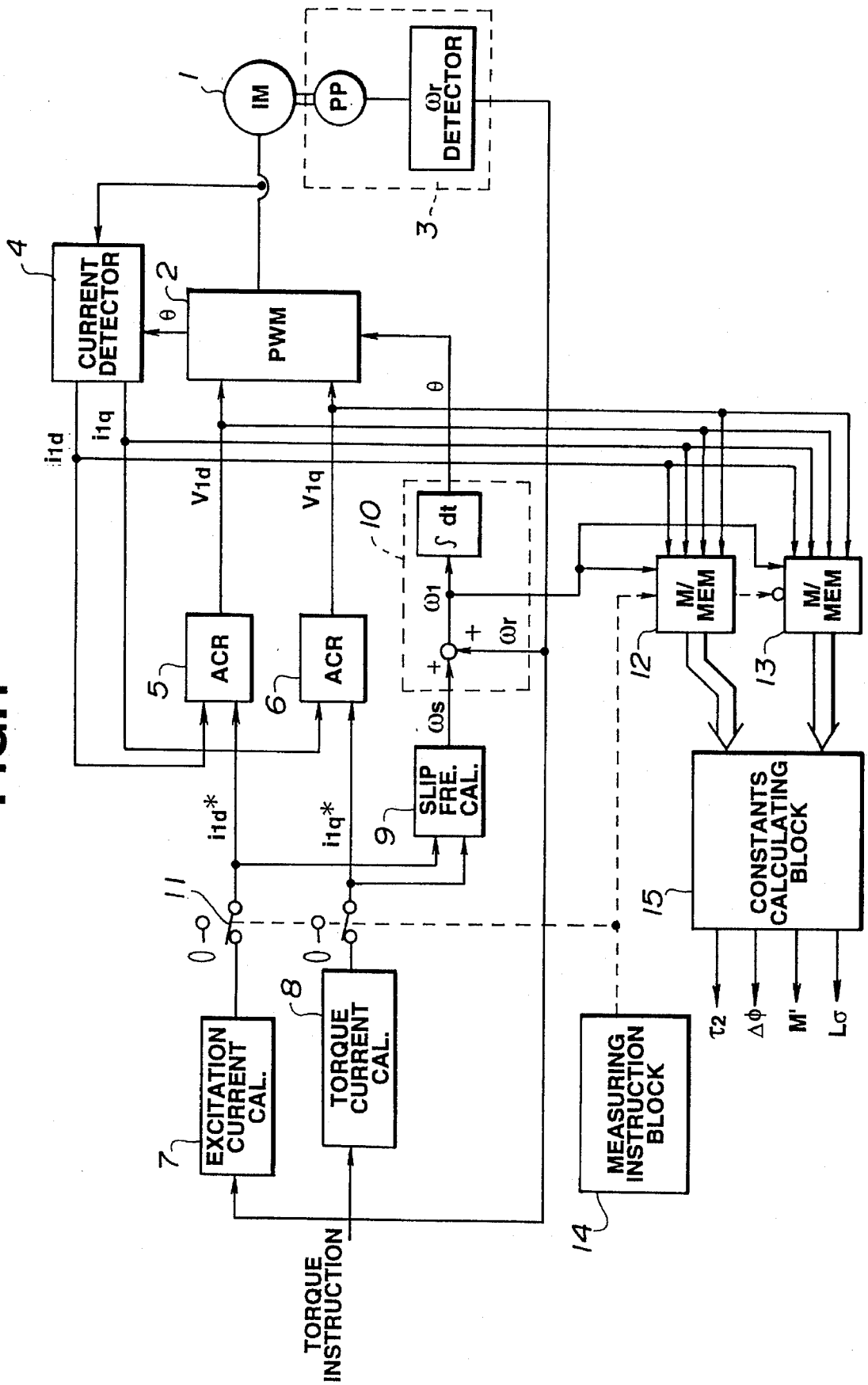
FIG. 1 is a circuit block diagram of a first embodiment of a motor constant measuring apparatus according to the present invention.

Reference will hereinafter be made to the drawing in order to facilitate a better understanding of the present invention.

A locked rotor test and no-load test carried out in the way described in the BACKGROUND OF THE INVENTION is exemplified by an English version of JEC-37$_{-1979}$ (standard of the Japanese Electrotechnical Committee, INDUCTION MACHINES), the content of which is herein incorporated by reference.

A U.S. Pat. No. 5,136,228 issued on Aug. 4, 1992 exemplifies a rotating Cartesian coordinate system (d, q) having a d-axis held in coincidence with a secondary magnetic flux of an induction motor, the disclosure of which is herein incorporated by reference.

(First Embodiment)

A basic theory of measuring motor constants using a motor constant measuring apparatus in a speed variable apparatus in a first embodiment according to the present invention will be explained below with reference to FIGS. 2 through 8.

(1) Approximation to an Equivalent Circuit

Figure 2:
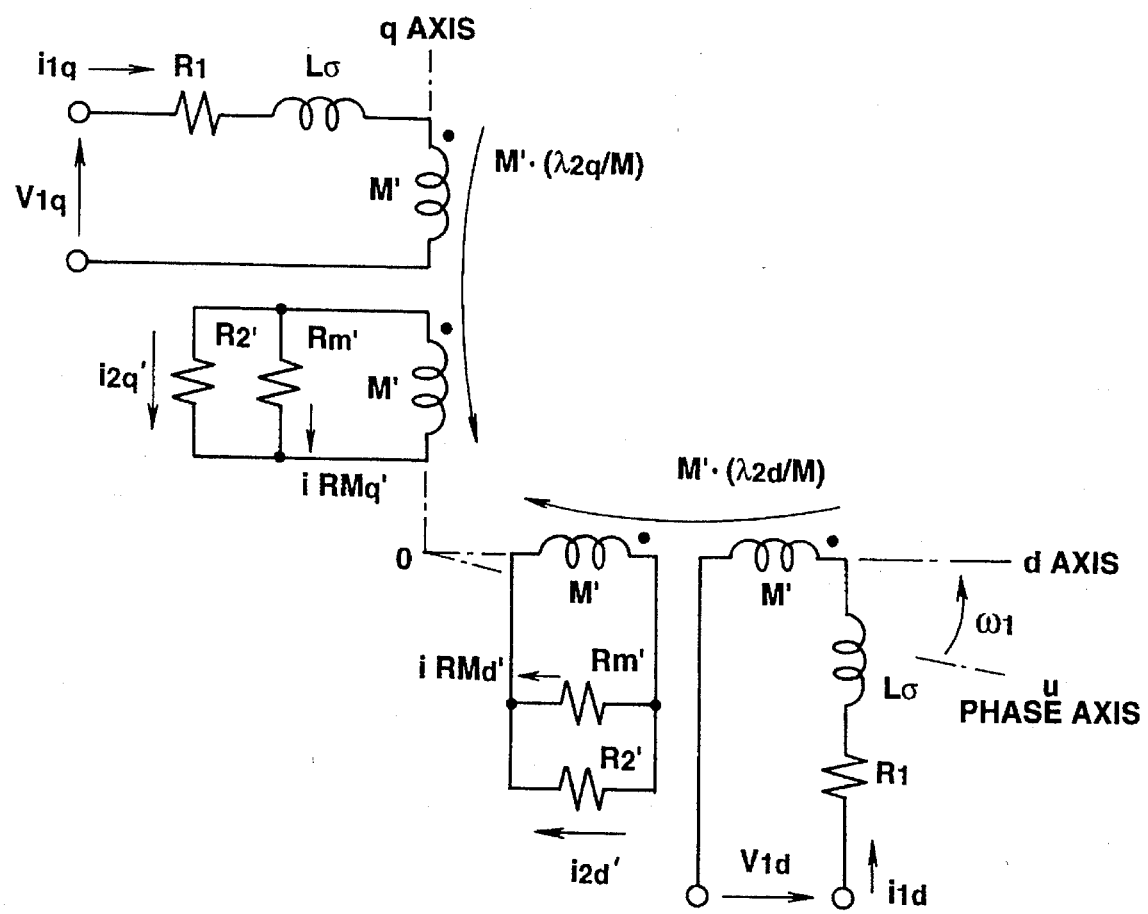
FIG. 2 is an explanatory view of a T-I shaped equivalent circuit of an induction motor to which the present invention is applicable in which d axis circuit and q axis circuit are separated from each other.

In a vector control system applicable to constants measuring apparatus according to the present invention, an iron loss component is handled to be an iron loss resistance $R_m'$ connected in parallel to an excitation inductance M' in a T-I shaped equivalent circuit shown in FIG. 2 of an internal electrical configuration of the induction motor so as to simply identify a circuit structure of the motor. This is because an iron loss current circuit and a secondary circuit (rotor part of the motor) are closely coupled by means of the excitation inductance M' and both circuits described above are approximated to have no leakage components.

This approximation condition is applied to the equivalent circuit on two coordinate axes in order to simplify the vector control and the iron loss current circuit and secondary circuit are handled as having parallel resistances of a secondary resistance $R'_2$ and iron loss resistance $R'_m$ as shown in FIG. 2 which represents the T-I shaped equivalent circuit in which two d–q axis circuits are separated from each other.

(2) Basic Circuit Equation

In the equivalent circuit shown in FIG. 2, a voltage-current equation in a matrix form on the two coordinate axes (d–q axes) which rotate in synchronization with a power supply frequency $\omega_I$ is established as:

$$\begin{bmatrix} V_{1d} \\ V_{1q} \\ 0 \\ 0 \end{bmatrix} = \begin{bmatrix} R_1 + PL\sigma & -\omega_1 L_1 & PM' & -\omega_1 M' \\ \omega_2 L_1 & R_1 + PL\sigma & \omega_1 M' & PM' \\ PM' & -\omega_s M' & R_{2m}' + PM' & -\omega_s M' \\ \omega_s M' & PM' & \omega_s M' & R_{2m}' + PM' \end{bmatrix} \begin{bmatrix} i_{1d} \\ i_{1q} \\ \lambda_{2d}/M \\ \lambda_{2q}/M \end{bmatrix} \quad (1)$$

It is noted that a primary circuit represents a stator and a secondary circuit represents a rotor of the induction motor.

In the equation (1), $V_{1d}$ and $V_{1q}$ denotes primary (circuit) voltages on the d axis and q axis, respectively, $i_{1d}$ and $i_{1q}$ denote primary (circuit) currents on the d axis and q axis, respectively, $\lambda_{2d}$ and $\lambda_{2q}$ denote secondary (circuit) inter-linkage magnetic fluxes on the d axis and q axis, respectively, $\omega_1$ denotes the power supply frequency, i.e., a primary (circuit) angular frequency, $\omega_s$ denotes a slip angular frequency, $R_1$ denotes a primary (circuit) resistance, $R_2$ denotes T-I shaped equivalent circuit secondary (circuit) resistance, $L_\sigma$ denotes a primary leakage inductance in the T-I shaped equivalent circuit, M' denotes a primary (circuit) excitation inductance in the T-I shaped equivalent circuit, Rm' denotes an iron loss in the T-I shaped equivalent circuit, M denotes an excitation inductance in a T-shaped equivalent circuit, and P denotes a differential operator, and, in the equation (1), $R_{2m}'=1/(1/R_2'+1/R_m')$ (3) Vector Components During a steady-state Driving of the Motor In the vector control system having the current control system (ACR), an alternating voltage is supplied from a semiconductor power converting block including a voltage type inverter and its alternating current supplied to the motor connected to the semiconductor power converting block is controlled by means of the current control system (usually, so-called ACR) which calculates the alternating current in the form of the vector control mode. Current instructions to the ACR includes a torque current instruction $I_{1q}$ and an excitation current instruction $I_{1d}$.

In a steady-state driving with an arbitrary output rotation speed and with any load torque on the motor, current components on the d axis and q axis are given as follows;

$$(i_{1d})_{-0} = (\lambda_{2d}/M)_{-0}$$

$$(\lambda_{2q}/M)_{-0} = 0$$

$$(i_{1q})_{-0} = (i_{2q}')_{-0} + (iRM_q')_{-0} \ldots \ldots \quad (2)$$

In the equations (2), $(i_{1d})_{-0}$ denotes a primary d-axis current component during the steady state, $(i_{q1})_{-0}$ denotes a primary q-axis current component during the steady-state driving, $(\lambda_{2d}/M)_{-0}$ and $(\lambda_{2q}/M)_{-0}$ denote d-axis and q-axis components of the secondary interlinkage magnetic flux divided by M, $(i_{2q}')_{-0}$ denotes a secondary torque current component, and $(i_{RMq}')_{-0}$ denotes a secondary iron loss current component.

As appreciated from the equations (2), the excitation current is present as flowing of the d-axis component and the torque current component and iron loss current component are present as flowing on the q-axis component. Each component is denoted by $(\ )_{-0}$ as during the steady-state driving.

Figure 3:
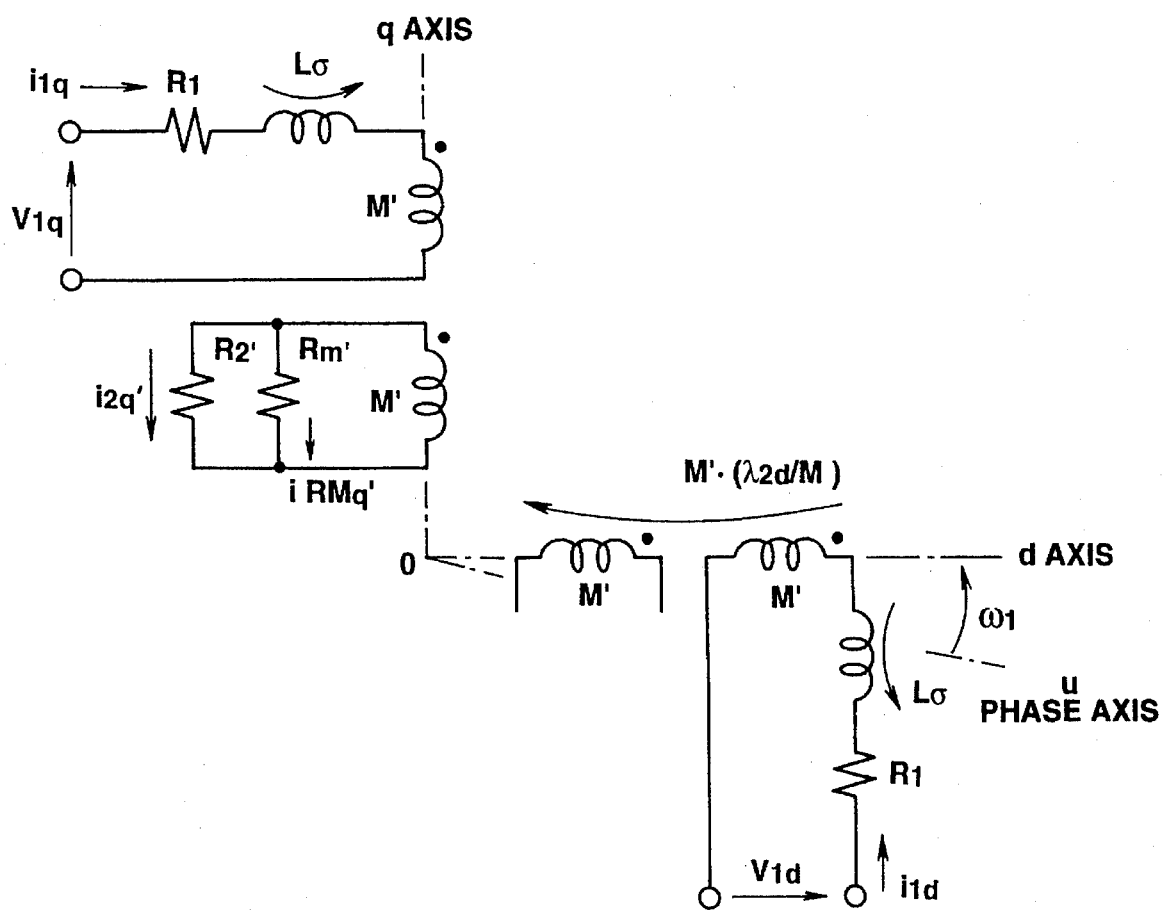
FIG. 3 is an explanatory view of a current and magnetic flux of a primary circuit (stator) and a secondary circuit (rotor) of the induction motor shown in FIG. 2 during a steady-state driving state.

If the above-described conditions of the equations (2) are applied to the equivalent circuit shown in FIG. 2, the result is shown in FIG. 3.

Suppose that an actual magnetic flux axis is the d-axis and three kinds of components are present on the magnetic flux components during the steady-state condition;

(1) a magnetic flux component interlinked to the secondary circuit due to the presence of the excitation current; $(\lambda_{2d}/M)_{-0}$,
(2) a leakage magnetic flux component which does not interlink to the secondary circuit due to the presence of the excitation current; $L_\sigma \cdot (i_{1d})_{-0}$,
(3) a leakage magnetic flux component $L_\sigma \cdot (i_{1q})_{-0}$ which does not interlinked to the secondary circuit due to the presence of the torque current.

It is noted that $(\lambda_{2q}/M')_{-0}$ gives zero as in the equation (2).

Figure 4:
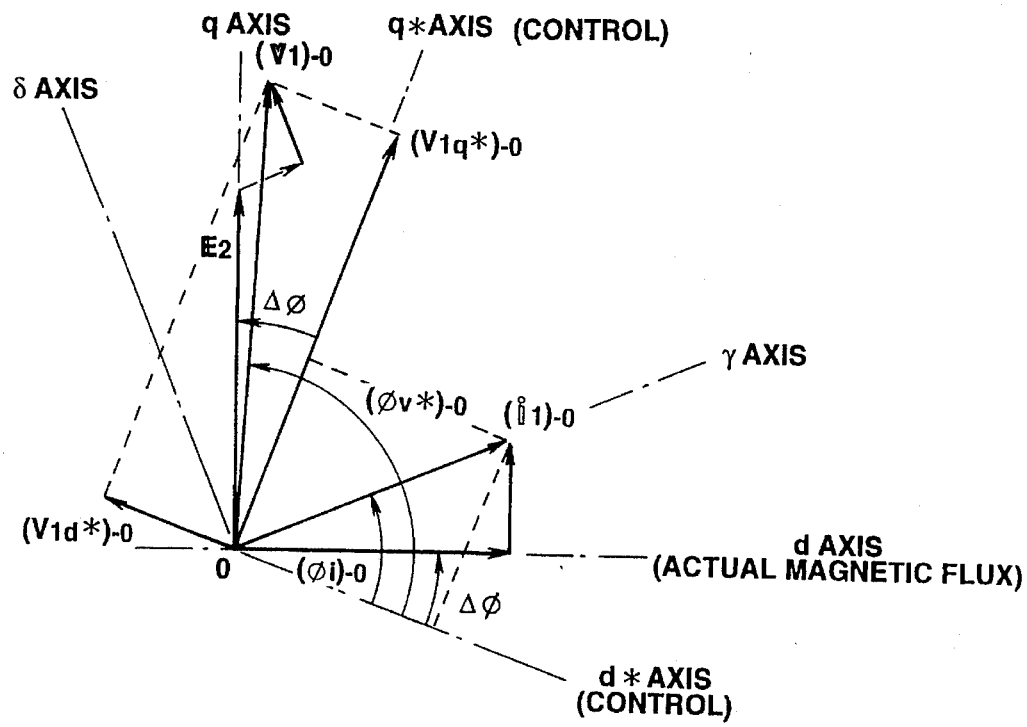
FIG. 4 is an explanatory view of voltage state vectors in the case shown in FIG. 3.

FIG. 4 shows a spatial vector view of the voltage-current components during the steady-state driving.

In FIG. 4, other two axes of $\delta$ and $\gamma$ are present. The U.S. Pat. No. 5,136,228 exemplifies the other rotating coordinate axis system of $\delta$ and $\gamma$, the disclosure of which is herein incorporated by reference.

In FIG. 4, $E_2$ denotes a secondary circuit voltage on the q axis.

(3) Current, Voltage, and other components immediately after the current instructions have abruptly been changed to zero:

When the current instructions (excitation and torque instruction currents) to the ACR are abruptly changed in a stepwise manner to zero during the steady-state driving described above, the following case occurs provided that a response to the ACR is sufficiently speedy and an output voltage capacity to the current control system (ACR) is sufficiently large.

That is to say, the primary current of the motor is instantaneously changed to zero. At this time, a magnetic energy related to the leakage magnetic flux in the d-axis and q-axis components interlinked to the leakage inductance $L_\sigma$ is absorbed to the power supply via the semiconductor power converting block and changed to zero.

However, the secondary interlinkage magnetic flux component on the d axis, at this time, tries to maintain its magnetic flux state even when the primary current gives zero since it does not interlink with the primary circuit. Therefore, the secondary magnetic flux component on the d axis is commutated into the secondary circuit on the d axis when the primary current component on the d axis $(i_{1d})_{-0}$ gives zero. A symbol of $(\ )_{+0}$ is attached on each component to indicate each state immediately after the current instructions have been changed in the stepwise manner to zero.

$$(\lambda_{2d}/M)_{+0} = -(i_{2d}')_{+0} = (i_1)_{-0} \ldots \quad (3)$$

Figure 5:
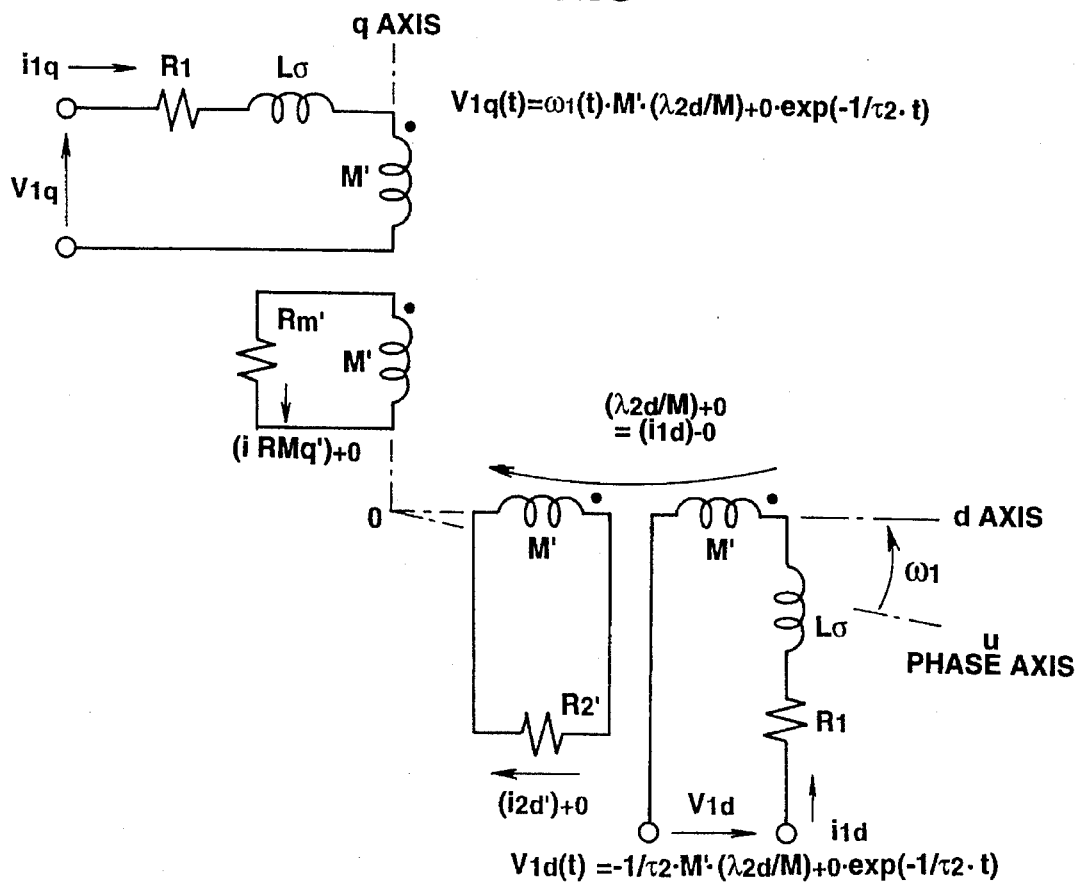
FIG. 5 is an explanatory view representing a current and magnetic flux in the primary and secondary circuits during an abrupt change of the current to zero.
Figure 6:
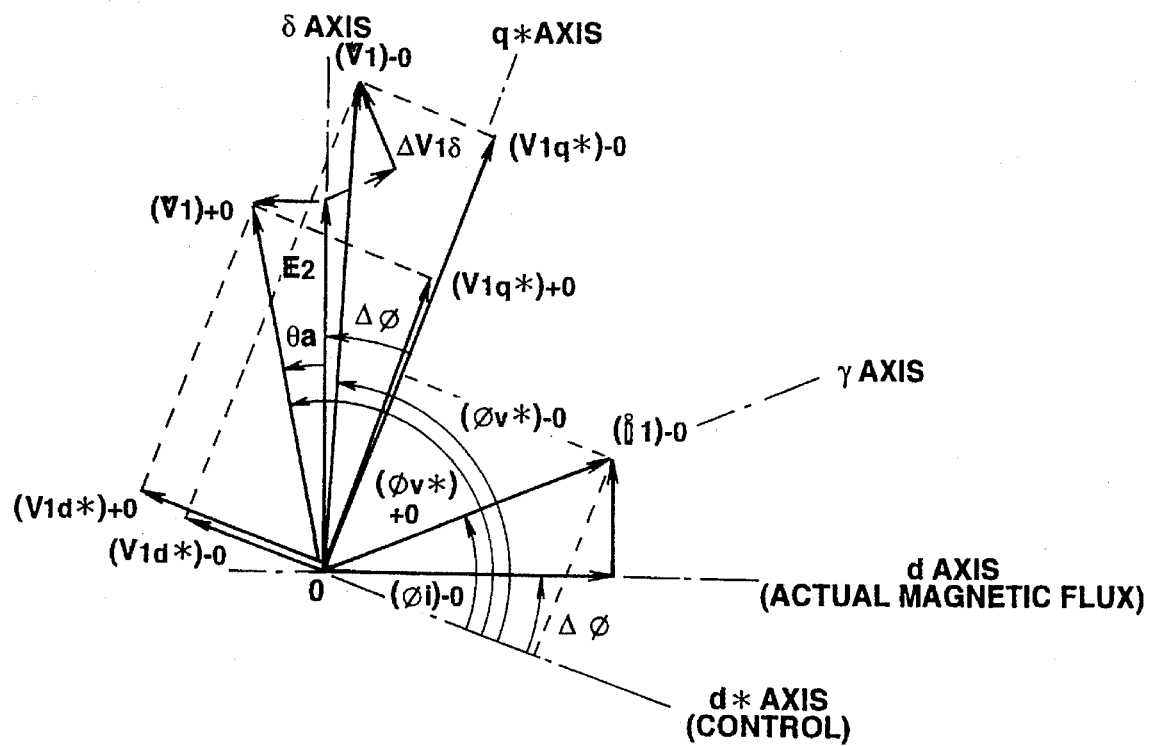
FIG. 6 is an explanatory view of the voltage state vectors in the case shown in FIG. 5.

The vector component states immediately after the abrupt change in the current instructions to zero are shown in FIG. 5 and a spatial vector corresponding to FIG. 5 is depicted in FIG. 6.

In this way, since the primary current becomes zero when the abrupt change in the current instructions to zero occurs, as the magnetic flux component only the above-described secondary interlinkage flux is included. The current components include the excitation current component $(i_{2d}')_{+0}$ and iron loss current component (or called an eddy current component) $(iRM'_q)_{+0}$. The iron loss current component $(iRM'_q)_{+0}$ is assumed to be negligibly small as compared with the excitation current component.

(4) Transient Phenomenon at a transient state (t) upon the abrupt change in the current instructions to zero:

Suppose that a rotor speed can continuously be detected and control axes (d–q axes) are rotating in synchronization with the rotor.

In addition, suppose that the primary current is maintained at a zero state.

At this time, the primary current is maintained at zero and the secondary circuit is not affected by the primary current.

Consequently, the secondary magnetic flux component and secondary current component on the coordinates of d–q axes synchronized with the rotor rotation simply change in a form of DC transient phenomenon in which a condition satisfying the equation (3) is an initial value and the secondary resistance $R'_2$ consumes an energy (secondary circuit power).

Hence, the secondary interlinkage magnetic flux provides such an equation (4) in which the value thereof is attenuated as an exponential function toward zero.

$$\lambda_{2d}/M(t) = (\lambda_{2d}/M)_{-0} \cdot \exp(-(1/\tau_2) \cdot t), \text{ and}$$

$$\lambda_{2q}/M(t) = 0 \ldots \ldots \quad (4)$$

wherein $\tau_2$: secondary circuit time constant $(=M'/R_2')$.

The voltage generated on the primary circuit due to the above-described secondary interlinkage magnetic flux attenuation has a d-axis voltage component (a transformer electromotive force due to a change in the magnetic flux itself) and a q-axis voltage component (a speed electromotive force due to a relative motion between the magnetic flux on the rotor and the starer), both axis components being expressed as follows;

$$V_{1d}(t) = P\{\lambda_{2d}/M\}_{+0} \cdot \exp(-(1/\tau_2) \cdot t)\} \quad (5-1)$$
$$= -(1/\tau_2) \cdot M' \cdot (\lambda_{2d}/M)_{+0} \cdot \exp(-(1/\tau_2))$$

$$V_{1q}(t) = \omega_1(t) \cdot M' \cdot (\lambda_{2d}/M)_{+0} \cdot \exp(-(/\tau_2) \cdot t). \quad (5-2)$$

Figure 7:
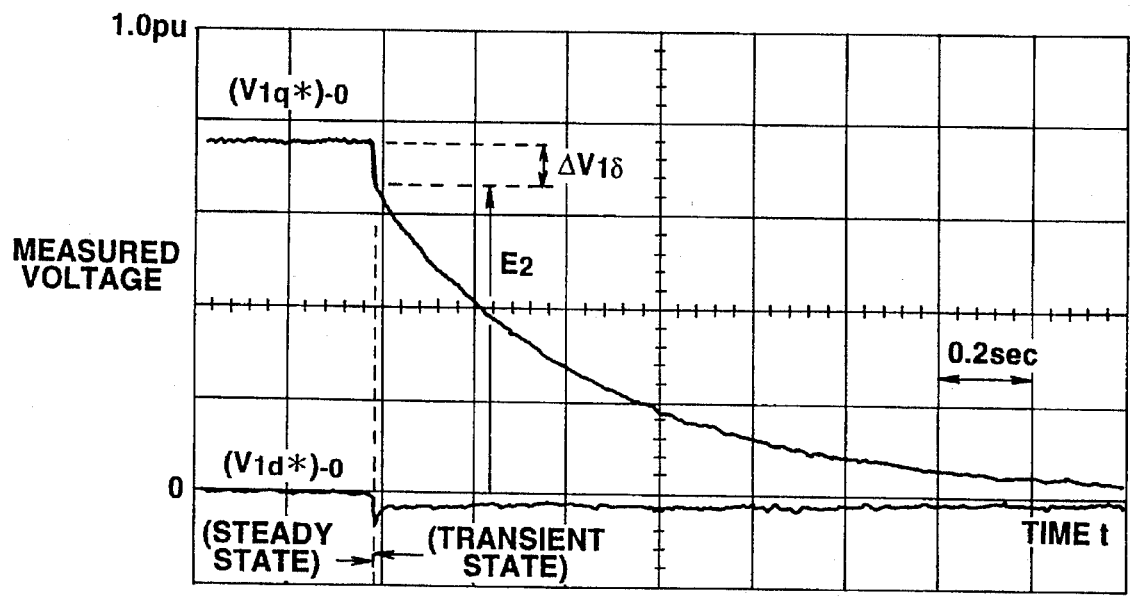
FIG. 7 is a transient voltage waveform chart when the abrupt change of the primary current to zero occurs.

FIG. 7 shows measurement waveforms on d* and q* axis components off control axes of the output voltages in the current control system actually when the current instructions are abruptly changed in the stepwise manner to zero using the speed variable apparatus described above.

As shown in FIG. 7, the voltage waveforms in the exponential functions expressed in the equations (5–1) and (5–2) are generated on respective axes. These d* axis and q* axis voltage components are measured and stored in a memory for a period of time corresponding approximately to the secondary circuit time constant.

(5) Calculation of Motor Constants (5a) Estimation of the secondary circuit time constant and voltage values immediately after the current instructions have abruptly been changed to zero due to the approximation of the exponential function;

It should be noted that the actual magnetic flux axes d (and q) are not always coincident with the magnetic flux axes d* (and q,) supposed in the internal vector control system. Actually, as shown in FIGS. 4 and 6, an axis deviation $\Delta\phi$ is sometimes present between these axes. Therefore, the control axes are, herein, defined by the symbols of d* and q* and actual measurements of the motor constants are based on the d, axis and q* axis.

According to the measurement data during the abrupt change in the current instructions in the stepwise manner to zero, the measurement values of voltages on the d* and q, axes during the transient state are approximated in the exponential functions defined in the following equations (6). The initial values of voltages and secondary circuit time constant immediately after the current instructions have abruptly been changed to zero in the stepwise manner are derived from coefficients attached to items of $(V_{1d}*)_{+0}$, $(V_{1q*})_{+0}$, and $\tau_{2q}*$ $$V_{1d}*(t)=(V_{1d*})_{+0}\cdot\exp(-(1/\tau_{2d*})\cdot t)$$
$$V_{1q*}(t)=(V_{1q*})_{+0}\cdot\exp(-(1/\tau_{2q*})\cdot t) \quad (6)$$

As viewed from the equations (6), since the measured voltage of the q axis component (speed electromotive force) has a magnitude larger than the d axis component, the secondary circuit time constant is used as $\tau_2 \approx \tau_{2q*}$ in place of $\tau_2$ from the viewpoint of measuring accuracy.

In addition, $(V_1d*)_{+0}$ and $(V_{1q*})_{+0}$ are determined to be approximate values of the initial values at the time of the transient phenomenon when the current instructions have rapidly been changed to zero.

(5b) Calculation of an axis deviation between a control axis and actual magnetic flux axis;

If the numbers of revolutions per time ($\omega_r$ (rotor angular frequency)=$\omega_1$ (power supply angular frequency) are approximated to be constant ($\omega_r=\omega_1\approx$constant), a ratio between the d, axis and q* axis voltage components provides a constant from the relationship between (5–1) and (5–2) as follows:

$$(V_{1d*})_{+0}/(V_{1q*})_{+0}=(-1/\tau_2)/\omega_1\approx\text{constant} \quad (7)$$

Therefore, if the attenuation of the primary power supply angular frequency (rotation speed) is less, the ratio of voltages on the respective control axes d, and q* becomes constant at any arbitrary time.

Figure 8:
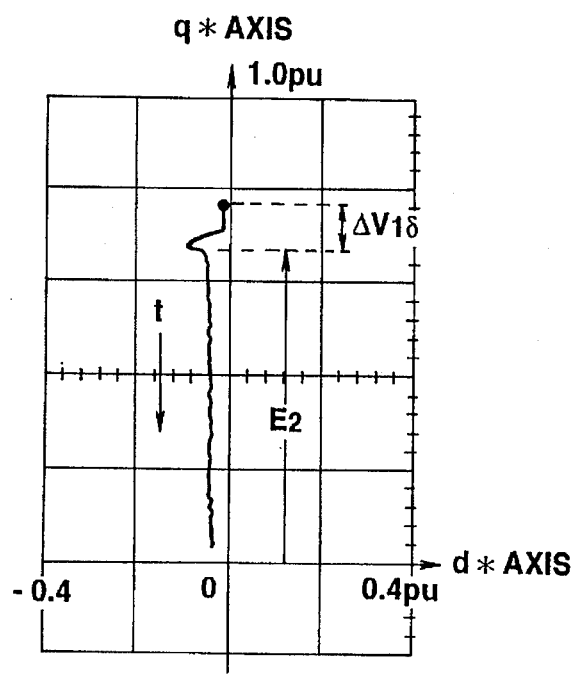
FIG. 8 is a characteristic graph of a voltage vector trajectory (locus).

FIG. 8 shows an actual example of this voltage ratio locus. In FIG. 8, the voltage components on the respective axes measured according to FIG. 7 are converted onto a plane coordinate of the d* axis and q* axis.

Although the voltage components are rapidly changed when the current instructins have rapidly been changed to zero in the stepwise manner, the voltage vectors are, thereafter, moved on a straight line expressed in the equation (8) crossing an original point as the time has elapsed.

$$V_{1q}(t)=(-\tau_2\cdot\omega_1)V_{1d}(t) \quad (8)$$

In other words, the measured voltage is a voltage of synthesis between the components of the speed electromotive force $V_{1q}$ on the q axis and of the transformer electromotive force on the d axis which is measured with respect to the control axes of d, and q*.

It will be appreciated that a q axis phase orthogonal to the actual magnetic flux axis is present at a phase rotated through a phase $\theta_a$ expressed in the following equation (9) from that of the measured voltage vector $(V_1)_{+0}$.

That is to say, $$\theta_a=\tan^{-1}(\tau_2'\cdot\omega_1) \quad (9)$$

The phases on the actual magnetic flux on the control axes are as follows:

$$(\phi v*)_{+0}=\tan^{-1}\{(V_{1q*})_{+0}/(V_{1d*})_{+0}\}$$
$$\Delta\phi=(\phi_{v*})_{+0}-\theta_a-90°. \quad (10)$$

As appreciated from the equations (10) and (9), since the value of $\omega_1$ is known according to the driving condition of the motor, for the time constant $\tau_2'$, the coefficients of the approximations in the above equations (6) can be used $(=\tau_{2q*})$, and an axis deviation angle $\Delta\phi$ can be calculated from the measured and calculated results at the passed time up to now.

(5c) Calculations of the excitation inductance M' and leakage reactance $L_\sigma$;

If the axis deviation phase component $\Delta\phi$ is derived, the excitation inductance M' can be calculated from the speed electromotive force component, $(V_{1q})_{+0}=E_2$, and the excitation current component orthogonal thereto.

That is to say, the speed electromotive force component is expressed as:

$$|E_2|=\{(V_{1d*})_{+0}^2+(V_{1q*})_{+0}^2\}^{1/2}\cos(\theta_a) \quad (11)$$

In addition, the excitation current component is expressed as:

$$(I_0)_{+0}=|(i_1)_{-0}|\cdot\cos(\phi_i-\Delta\phi)\}. \quad (12)$$

From these equations (11) and (12), the excitation inductance M' can be derived from the following equation (13).

$$M'=|E_2|/\{\omega_1\cdot|(i_1)_0|\cdot\cos(\phi_i-\Delta\phi)\}. \quad (13)$$

It is noted that the leakage reactance (inductance) $L_\sigma$ can be derived from a component (on the $\delta$ axis) orthogonal to a current of a difference voltage between the voltage $(V_1)_{-0}$ and $E_2$ at the time of the steady-state driving and from the current component during the steady-state driving condition using the following equations (14).

$$\Delta V_1 \delta = |(V_1)_{-0}| \sin\{(\theta_{v*})_{-0} - (\phi_{i*})_{-0}\}$$
$$-|E2| \sin\{(\phi_{v*})_{+0} - (\phi_{i*})_{-0} - \theta_a\}$$
$$L\sigma = \Delta V_1 \delta / \{\omega_1 \cdot |(i_1)_{-0}|\} \ldots \ldots \quad (14)$$

(5d) Calculations of the excitation inductance M' and leakage reactance $L_\sigma$ under the no-load driving condition:

On the other hand, under the no-load driving condition, the above-described axis deviation is negligible and the following conditions are established:

$$(i_1)_{-0} \approx (I_{1d*})_{-0} \theta_a \approx 0 |E_2| \approx (V_{1q*})_{+0}$$
$$\Delta V\delta \approx (V_{1q*})_{-0} - (V_{q1*})_{+0} \ldots \ldots \quad (15)$$

Then, the following formulae are established:

$$M' = (V_{1q*})_{+0} / \{\omega_1 \cdot (I_{1d*})_{-0}\}$$
$$L\sigma = \{(V_{1q*})_{-0} - (V_{1q*})_{+0}\} / \{\omega_1 \cdot (I_{1d*})_{-0}\} \ldots \ldots \quad (16)$$

From the above-described theory of measurement, in the first embodiment, the motor constants when the load torque is present can be calculated from the current and voltage measured values during the steady-state driving and from the current and voltage measured values when the current instructions have rapidly been changed in the stepwise manner to zero.

Next, referring to FIG. 1, FIG. 1 shows a circuit block diagram of the motor constant measuring apparatus applicable to the vector control system for the induction motor in the first embodiment.

As shown in FIG. 1, an alternating voltage in the PWM (Pulse Width Modulated) waveform under the vector control is supplied to the induction motor 1 from the semiconductor power converting (or inverting) block (voltage type inverter) 2. The rotor speed $\omega_r$ of the induction motor 1 is detected by means of a speed detector 3. It is noted that PP shown in FIG. 1 is well known pulse encoder. The primary current of the induction motor 1 is detected with the primacy circuit current separated into the torque current component and excitation current component by means of a current detector 4.

Current control systems (ACR (automatic current regulator)) 5 and 6 compare the excitation current instruction value $i_{1d*}$ and the torque current instruction $i_{1q*}$ with corresponding detected current components from the current detector 4, respectively, and provides an excitation voltage control signal $V_{1d}$ and torque voltage control signal $V_{1q}$ for the semiconductor power converting block (PWM) 2 so that the currents are generated in the motor 1 which accord with the corresponding current instructions.

An excitation current calculating section 7 inputs a speed detection signal $\omega_r$ from the corresponding detector 3 and outputs the excitation current instruction (or excitation magnetic flux) $i_{1d*}$. A torque current calculating section 8 derives the torque current component orthogonal to the magnetic flux from a torque instruction derived from, for example, a speed control system (so-called ASR (automatic speed regulator) but not shown in FIG. 1) and outputs a torque current instruction $i_{1q}$.

A slip frequency calculating section 9 derives the slip frequency $\omega_s$ according to the excitation current instruction $i_{1d*}$ and the torque current instruction $i_{q1*}$.

A frequency and phase calculating section 10 adds the slip frequency $\omega_s$ and the rotor speed detected value $\omega_r$ to derive the frequency of the alternating voltage supplied to the induction motor 1 and integrates its frequency of the alternating voltage so as to derive an electrical phase θ of the magnetic flux.

In the first embodiment, calculating, storing and measuring circuits 11 through 15 shown in FIG. 1 are installed as the apparatus for measuring the circuit constants of the induction motor 1 in the speed variable apparatus of the vector control shown in FIG. 1.

An interlocking switch 11 is installed between the excitation current calculating section 7 and one of the ACRs 5 and between the torque current calculating section 9 and the other ACR 6 so as to be closed in response to a drive signal from a measuring instruction block 14 during the steady-state driving condition to provide the current instructions $i_{d*}$ and $i_{q*}$ from the excitation current and torque current calculating sections 7 and 8 for the respective ACRs 5 and G and so as to be open in response to a switch drive signal from the measuring instruction block 14 to abruptly change the current instructions $i_{1d*}$ and $i_{1q*}$ in the stepwise manner to zero.

A first measuring and memory section (M/MEM) 12 measures output current component detected values $i_{1d}$ and $i_{1q}$ (or current instructions $i_{1d*}$ and $i_{1q*}$), voltage control signals $V_{1d}$ and $V_{q1}$ (applied voltages to the induction motor 1), and angular frequency $\omega_1$ in the steady state driving condition before the interlocking switch 11 is switched in response to the switch drive signal for the switch 11 to be open so as to abruptly (or rapidly) change the current instructions to zero.

A second measuring and memory section (M/MEM) 13 measures and stores the output current detected values $i_{1d}$ and $i_{1q}$ (or current instructions $i_{1d*}$ and $i_{1q*}$), the voltage control signals $V_{1d}$ and $V_{1q}$ (or applied voltage to the induction motor 1), and angular frequency $e_f$ variations at the time of the transient state after the switch 11 for each sampled time is switched to be open so as to abruptly change the current instructions to zero.

The measurement instruction block 14 generates commands to measure and store the data of the above-described corresponding values to the first measuring and memory section 12 in the steady-state driving condition and to measure and store the data of the above-described corresponding values to the second measuring and memory section 13 simultaneously with the switch drive signal to the switch 11.

A motor constants calculating block 15 reads the data measured and stored in the first and second measuring and memory sections 12 and 13 and calculates the respective constants of the induction motor 1. This calculation includes the calculation of the secondary circuit time constant $\tau_2$ according to the equations (6), the calculation of the magnetic flux phase error $\Delta\phi$ according to the equation (10), the calculation of the excitation inductance M' according to the equation (13), and the calculation of the leakage inductance $L_\sigma$ according to the equation (14).

As an experiment in the first embodiment, the current control systems 5 and 6 controlled the voltage control components $V_{1d}$ and $V_{1q}$ described above in a PI (Proportional-Integral) mode and a tested induction motor 1 having a rating of 22KW-6P (P denotes a number of poles in the induction motor 1) and 325 V–1180 rpm was driven at 1,000 rpm so as to derive the above-mentioned constants.

As described above, FIG. 7 shows the waveforms of the voltage components of $V_{1d*}$ and $V_{1q*}$ when the current instructions are abruptly changed to zero during the no-load driving condition.

In the experiment of the first embodiment, the voltage waveforms shown in FIG. 7 were sampled at 17 points (for about $\tau_2/2$ time duration) per 20 ms to derive the respective constants.

Consequently, the axis deviation approximated by the equation (9) was $\Delta\phi=0.3°$ and the respective constants were calculated using the equations (16).

Figure 9:
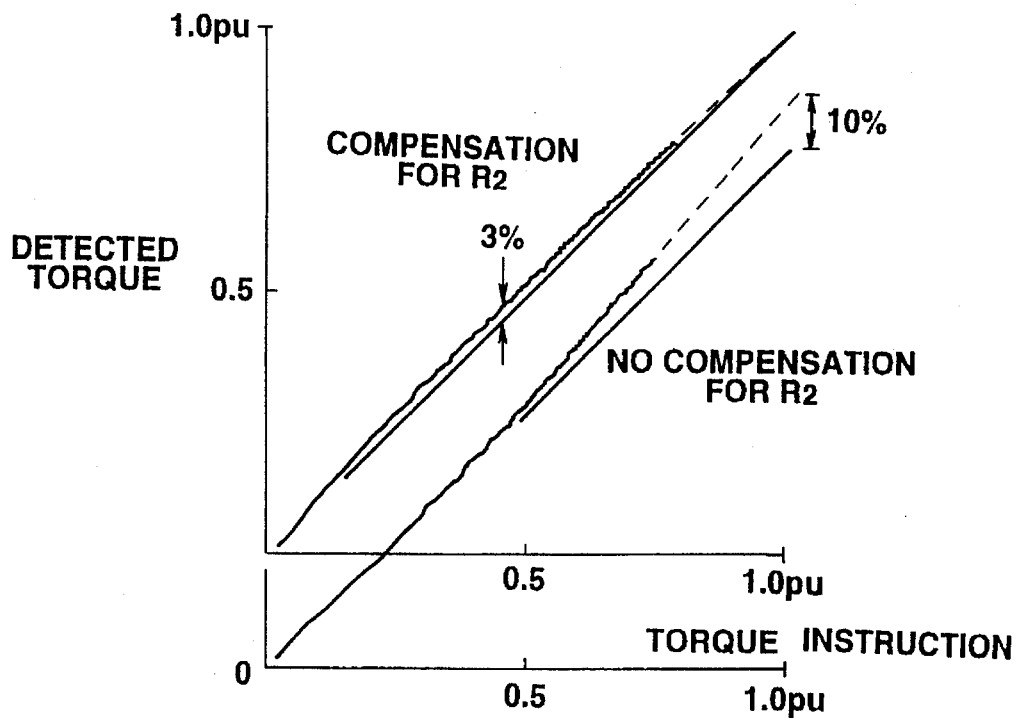
FIG. 9 is a torque characteristic graph of an output torque of the motor during the receipt of the vector control.

The results of the respective constants are listed below:
Measured constants results indicated as follows:
M' (name of constants)=16.4 mH (measured value)
$L_\sigma$=2.16 mH
$\tau_{2m}'$=0.50 s/rad
$\Delta\phi=0.3°$ To verify the accuracy of the results of constant measurements, a torque characteristic was measured with the test results applied to the speed variable apparatus using the vector control method. FIG. 9 shows the torque characteristic. It is noted that a compensation value of the iron loss current was zero and no correction for the iron loss current was carried out. In addition, the measurement up to 75% torque of a rating was carried out according to an installation situation of a load device to be applied to the output axle of the motor and an extraporation for a load region exceeding 75% was carried out as denoted by broken lines. In FIG. 9, pu denotes a torque per unit.

As appreciated form the characteristic shown in FIG. 9, a torque error by about 10% occurred at the time of the rated driving condition and it is estimated that the secondary circuit time constant $\tau_2$ was measured having a magnitude lower than the actual value of the motor in a case where a compensation for the secondary resistance $R_2$ is not present. This is because influences of a magnetic saturation and the iron loss resistance present in parallel to the secondary resistance $R_2$ may more or less be given to the measured value of the torque.

However, as shown in another torque characteristic shown in FIG. 9, the torque error could be improved by about 3% on the case where the compensation for the secondary resistance is added which utilizes the error voltage between the model (tested motor) of the induction motor and the output voltage of the secondary circuit. It was appreciated that the measured values of the excitation inductance M' and the leakage inductance $L_\sigma$ used in the model provided the accuracy which was sufficiently high for actual purpose at the revolution speed of the rotor of about 1,000 rpm. For the secondary resistance variation compensation of the induction motor, an electrical engineering paper D, pages 112, and 107 published on Feb., 1992 by Yamada et al, titled "Secondary resistance variation compensation of an induction motor improving a torque accuracy in a low speed range and in a high speed range" is exemplified.

In other wards, since the secondary circuit time constant (rotor time constant) itself is (non-linearly) varied according to its surrounding temperature during the driving. When the torque accuracy is actually tried to maintain its value of the torque, it is necessary to apply a feedback control for the compensation for the secondary resistance.

in other words, the secondary circuit time constant is varied during the driving, the accuracy of setting the initial value is not so demanded but its approximated value may be set.

On the contrary, the components of M' and $L_\sigma$ are directly affected by the accuracy of the secondary resistance compensation control described above. Therefore, in the case where the secondary resistance compensation is carried out to maintain the torque accuracy, it becomes necessary to provide the circuit constants of the motor with the high accuracy.

The constant measurement in the case of the first embodiment does not become unstable even if the compensation for the secondary resistance is not present and the measured value of $R'_2$ can be said to have sufficiently usable accuracy as the initial set value of the secondary resistance.

in addition, according to the experiment, it was appreciated that the measured components of M' and $L_\sigma$ provided the torque accuracy higher than the torque characteristic in a case where the secondary resistance compensation control was carried out, this torque accuracy having the value sufficiently practical.

In the first embodiment, since the output current (current instructions) is abruptly changed in the stepwise manner to zero, the secondary current can be generated using the commutation current effect. Thus, the generation of the secondary current can be assured even with the high frequency of the primary current. In addition, such a high frequency as described above causes a large speed electromotive force component and causes a less voltage detection error. Consequently, the measurements of the motor constants with high frequency can be made.

Since, in addition, the current instructions are zeroed and the output current is maintained at zero, voltages of the current control system are produced equal to the induced electromotive force of the induction motor. Therefore, if the output voltages of the current control system are measured, the equivalent voltage to the terminal voltage of the induction motor can be measured. That is to say, since a measuring instrument such as a voltage meter is not necessary, the speed variable apparatus itself can measure the terminal voltage. Furthermore, since the attenuation phenomenon of the secondary circuit is used, the frequency component of the magnetic flux change can be deemed to be approximately the secondary time constant. Hence, since a skin effect affecting the leakage inductance component can be measured under the condition proximate to the actual driving condition and the measurement accuracy of $L_\sigma$ is high.

(Second Embodiment)

Figure 10:
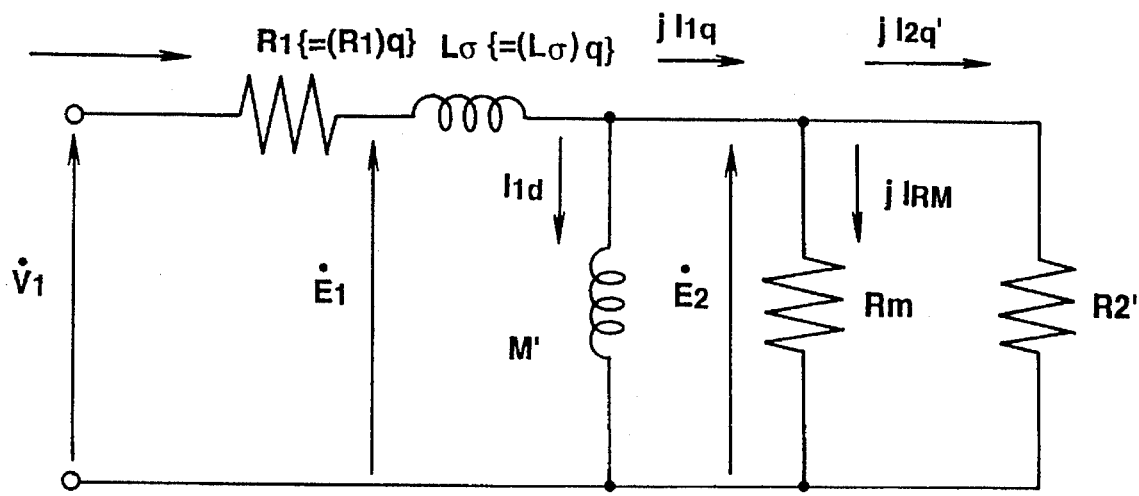
FIG. 10 is an explanatory view of another equivalent circuit of the induction motor used as a constant measurement model of the motor constant measuring apparatus in a second preferred embodiment according to the present invention.

FIG. 10 shows another T-I shaped equivalent circuit of the induction motor for explaining a theory of measurement in the case of a second embodiment.

Figure 11:
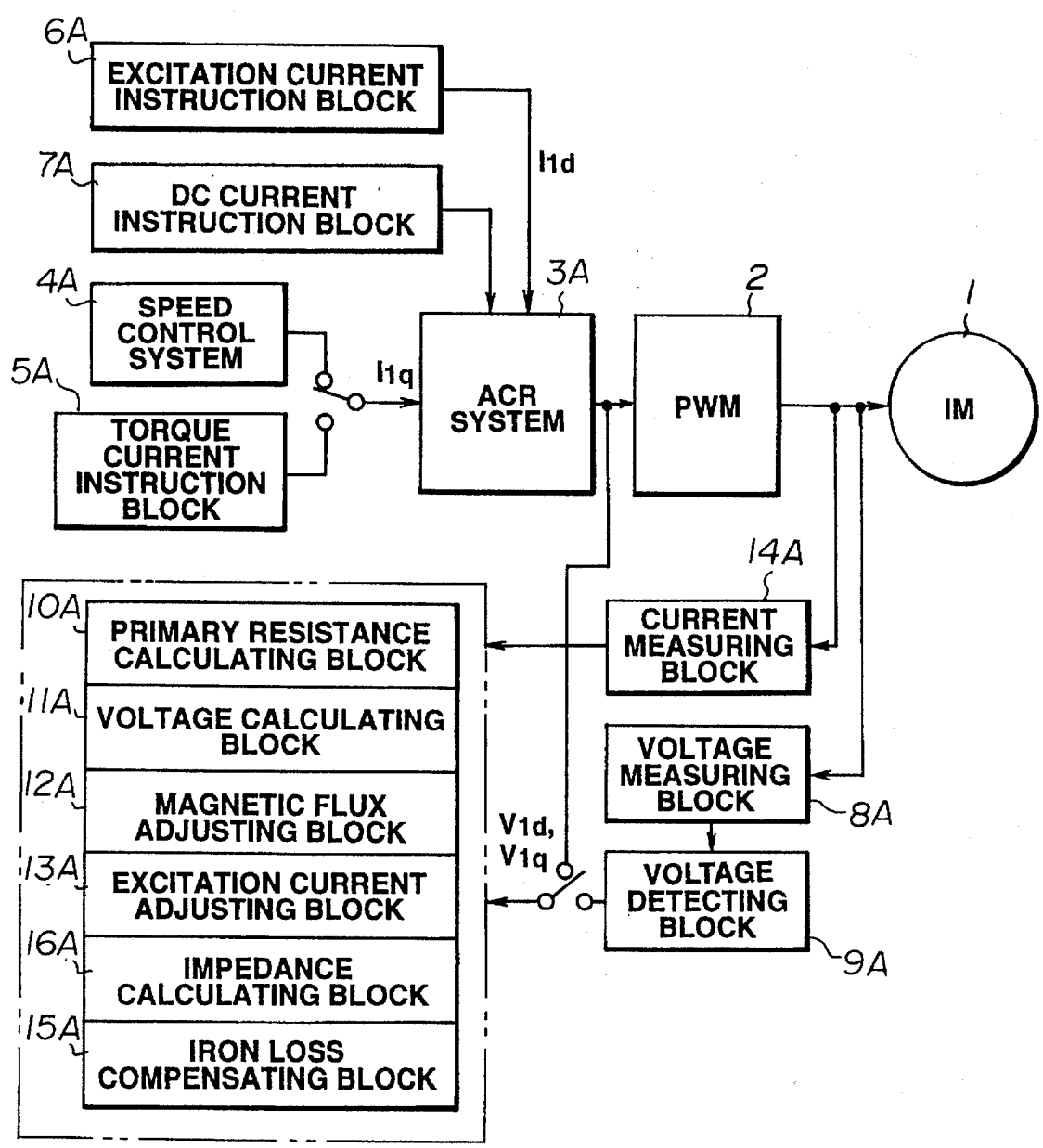
FIG. 11 is a functional block diagram of the motor constant measuring apparatus in the second preferred embodiment according to the present invention.

FIG. 11 shows a functional block diagram for explaining the motor constant measuring apparatus in the case of the second embodiment.

In the second embodiment, each motor constant is measured from the equivalent circuit to which the iron loss resistance (Rm) is added and the measurement of the motor constants is carried out utilizing the vector control type speed variable apparatus having the current control (ACR) system 3 as shown in FIG. 2.

In the speed variable apparatus shown in FIG. 11, the alternating voltage is supplied from the semiconductor power converting block 2 to the induction motor 1, its corresponding current being controlled by means of the current control system 3A under the vector control condition.

The current instructions to the current control system 3 includes the torque current instruction $I_{1q}$ from either a speed control system 4A or a torque current instruction block 5A and an excitation current $I_{1d}$ from an excitation current instruction block 6A.

(1) DC Current Test

Phases of the output current from the power converting block (PWM) 2 are fixed to a certain phase and a DC current instruction block 7A serves to set and switch four kinds of the DC current I, i.e., $I_1$, $I_1/2$, $-I_1$, and $-I_1/2$. A voltage measuring block 8A measures U-phase, V-phase, and W-phase voltage of the output voltage of the power converting block 2 according to the current instructions. A voltage detecting block 9 derives voltages $V_{1d}$ and $V_{1q}$ of the rotating coordinate system according to the measured values. In place of the voltage detecting block 9A, output voltage instructions of the current control system 3 may be used, in addition, the phase voltages of the measured values may be accepted in place of the two-axis components.

Figure 12:
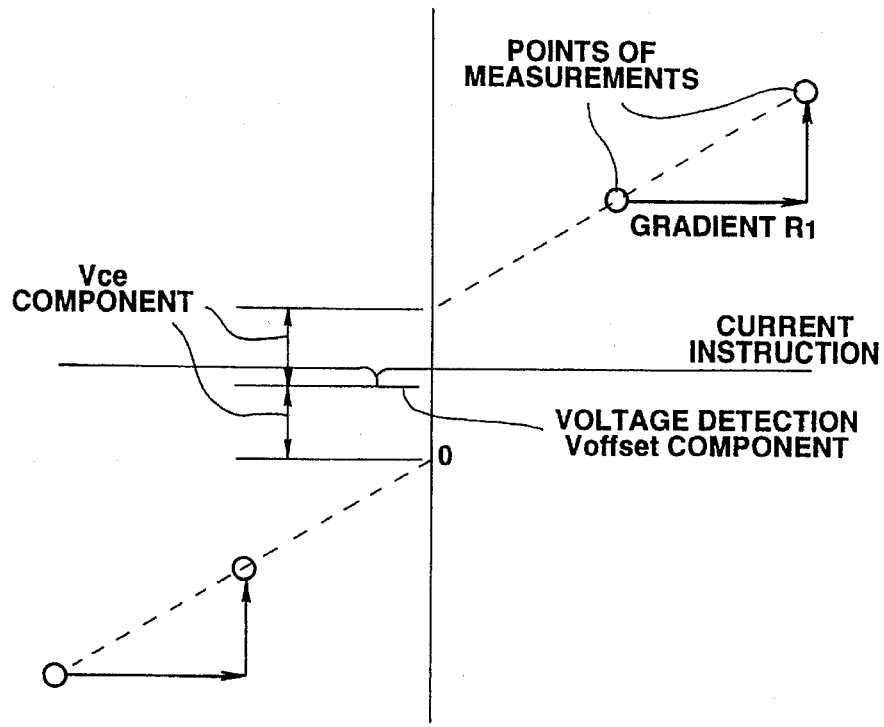
FIG. 12 is an explanatory view of a primary resistance and an offset voltage measurement.

FIG. 12 shows a graph representing the current instructions and output voltage of the power converting block 2. A gradient between both points of measurements of the ACR system output phase voltages denotes the primary resistance $R_1$ component of the equivalent circuit and is derived by means of a primary resistance measuring block 10A.

Next, a voltage calculating block 11A serves to derive an offset of the voltage components by extraporting the currents to zero as denoted by the broken lines from the characteristic shown in FIG. 12.

This voltage offset component is derived from a voltage drop component $V_{ce}$ of the power converting block 2 with a difference between the voltage offsets at the positive and negative current polarities as $2*V_{ce}$ so as to derive a voltage drop component $V_{ce}$ of the power converting block 2. An average value of the voltage offset in the positive and negative current polarities is derived as the voltage detection offset in the corresponding phase.

(2) No-Load Test/Zero Current Test

The speed control system 4A drives the induction motor 1 under no-load condition and, in this state, a magnetic flux adjusting block 12A derives a torque axis voltage $V_{1q}$ from either the detected voltage of the voltage detecting block 9A or the voltage instruction output of the current control system 3A so that the speed electromotive force $E_{q1}$ is derived by subtracting the torque current component $I_{1q}$ and a voltage drop component due to the primary resistance $R_1$ from that torque axis voltage $V_{1q}$. The output of the excitation current instruction block 6A is corrected as that the speed electromotive force $E_{q1}$ becomes coincident with a designed value thereof, converging the excitation current $I_{1d}$ during the no-load driving condition.

It is noted that although, in the vector control mode, the secondary magnetic flux is controlled if the primary speed electromotive force is coincident with the design value, the primary magnetic flux becomes the design value and the secondary magnetic flux becomes approximately equal to the designed value. Therefore, the speed electromotive force $E_{1q}$ may be adjusted to give the designed value.

On the contrary, if the value of $E_{1q}$ can be adjusted, an establishment of the magnetic flux was confirmed according to the actual measurement with the magnetic saturation considered. Therefore, with a pattern of the excitation current lid stored, the excitation current instruction will be issued during the driving condition of the motor 1.

An excitation current adjusting block 13 derives an induced voltage $E_{1q}$ during the no-load condition from the voltage $V_{1q}$ at the convergence time of the excitation current, torque current $I_{1q}$, and primary resistance $R_1$.

This calculation is as follows:

$$E_{1q0} = V_{1q} - R_1 \cdot I_{1q} \ldots \quad (17)$$

These series of calculations are stored for respective rotation speeds and are issued as the excitation current instructions at the actual driving condition of the motor 1.

The excitation inductance M', the equivalent leakage inductance $L_\sigma$, and secondary circuit time constant $\tau_2$ can be derived from a voltage change in the motor at the time when the supplied current to the motor 1 is changed to zero in a stepwise manner under the no-load, constant speed driving state with these excitation currents set as the instruction values.

Herein, the reason that the respective circuit constant values M', $L_\sigma$, and $\tau_2$ can be derived under the no-load driving condition and under the zero current control described above will be explained below.

Figure 13:
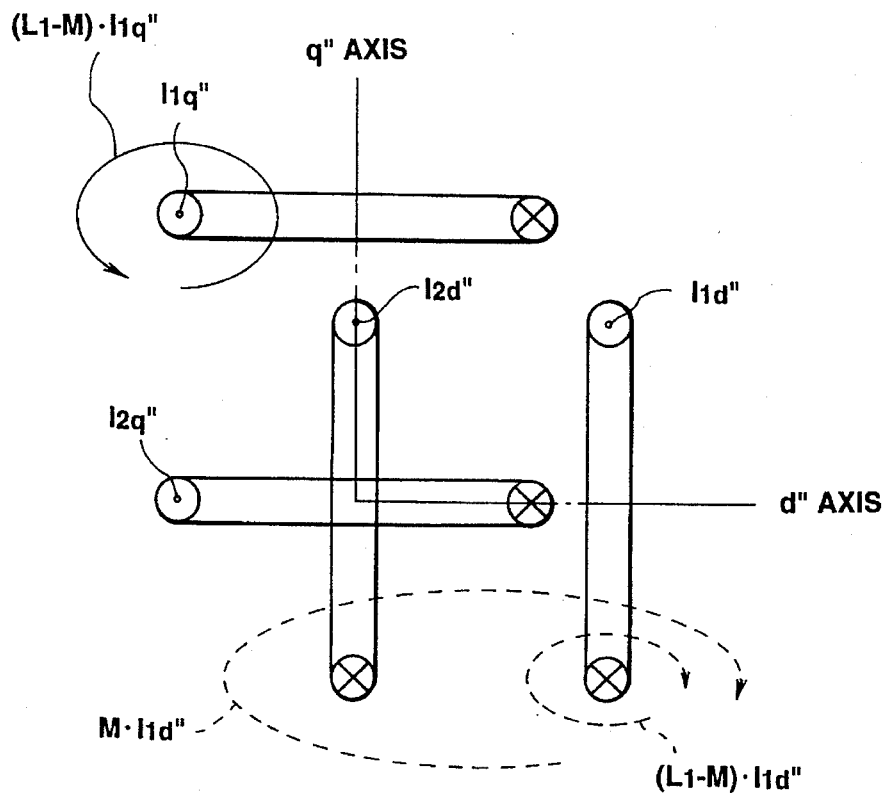
FIG. 13 is an explanatory view of relationship between magnetic fluxes in two orthogonal axes.

First, if a d" axis (an actual magnetic flux axis of the induction motor 1 not the control axis) is coincident with the secondary axis of the motor 1 during the no-load driving driving condition, the interlinkage axis is present as the primary leakage magnetic flux of the d" axis and q" axis and the secondary interlinkage magnetic flux of the d" axis, as shown in FIG. 13.

The secondary interlinkage magnetic flux is the multiplication of the excitation inductance with the same phase component $I_{1d}"$ as the secondary magnetic flux of the primary current. That is to say, $$\phi_{2d}" = M \cdot I_{1d*} \ldots \quad (18)$$

It is noted that in the equation (18), the value of $I_{1d}$ cannot be measured and M is the value in a T shaped equivalent circuit as different from M'.

Figure 14:
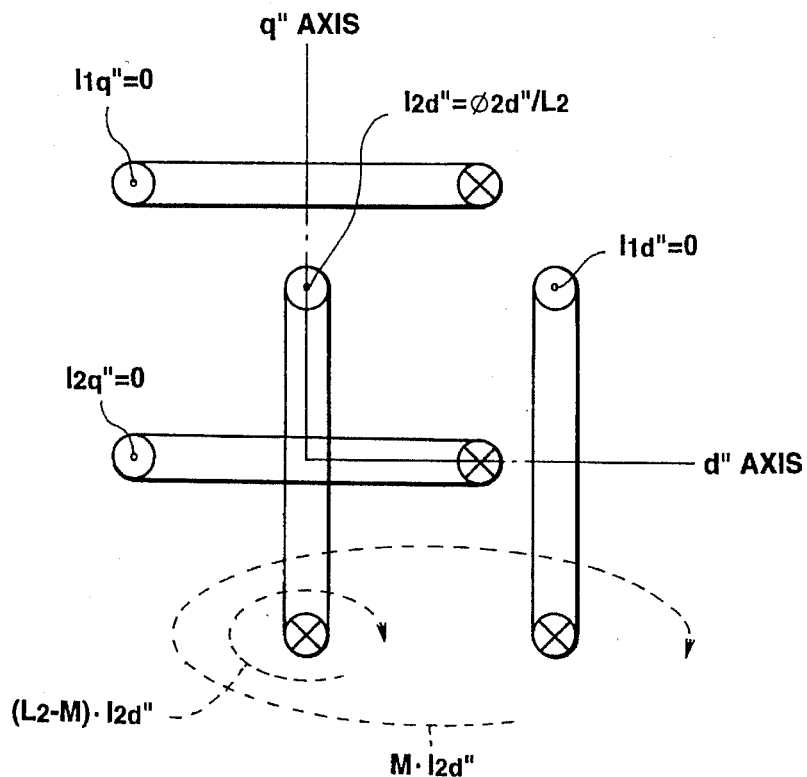
FIG. 14 is an explanatory view of a current and voltage waveforms during the zero current.

Next, if no limitation is placed in the primary voltage and the primary current can instantaneously be set to zero, a magnetic energy of the magnetic flux interlinked to the primary leakage inductance $(L_1 - M)$ is instantaneously zero with a drive circuit of the current control system absorbed. At this time, as shown in FIG. 14, the $I_{2d*}$ is commutated and generated so as to maintain the secondary interlinkage magnetic flux component interlinked to the secondary leakage inductance $L_2$ during the rotation of the axes. That is to say, $$I_{2d}" = \phi 2d"/L_2 \ldots \quad (19)$$

The primary winding induced electromotive force due to the value of $I_{2d}$ is expressed as:

$$E_{2q}" = \omega_1 \cdot M \cdot I_{2d}" \ldots \quad (20)$$

wherein M denotes a driving angular frequency.

The secondary magnetic flux immediately before and immediately after the current change to zero occurs is constant and the following equation is established.

$$E_{2q}" = \omega_1 \cdot M \cdot (M/L_2) \cdot I_{1d}" \quad (21)$$
$$= \omega_1 \cdot M" \cdot I_{1d}"$$

wherein $M" = (M^2/L_2)$.

As described above, the primary induced voltage when the current is rapidly changed to zero represents the voltage due to the magnetic flux component of the excitation inductance M' in the T-I shaped equivalent circuit before the change in the current to zero occurs.

In addition, since, for the speed electromotive force $E_{q1}$ during the no-lead steady-state driving condition, the synthesized value between M" and equivalent leakage inductance $L_\sigma$ is already measured so that the magnetic flux component of the equivalent leakage inductance $L_\sigma$ can be derived from the difference between M" and $L_\sigma$. Furthermore, an energy flow into the induction motor 1 from the power converting block 2 when the current zero state is maintained is not present so that the power is consumed only by means of the secondary resistance. Thus, the magnetic flux can exponentially be decreased. If this attenuation of the secondary magnetic flux is measured as the voltage $V_{1d}$, the secondary circuit time constant $\tau_2$ can be derived.

Figure 15:
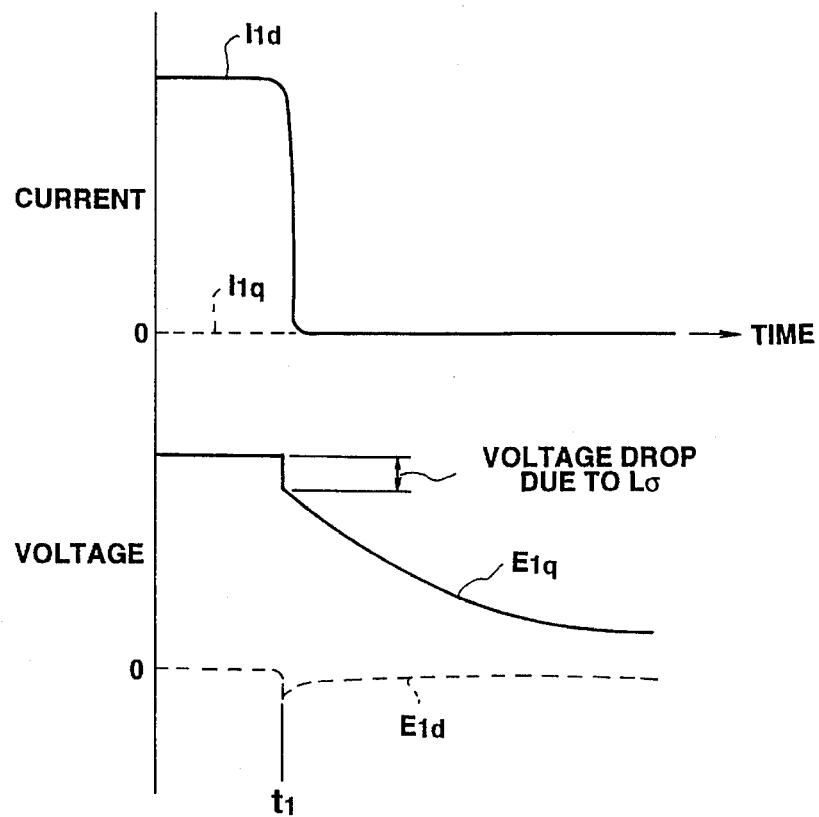
FIG. 15 is an explanatory view of the voltage and current waveforms during the zero current.

FIG. 15 shows the measured output voltage and current waveforms when the current change to zero occurs in the stepwise manner during the no-lead driving condition.

The currents give zeros on both d axis and q axis, for the q-axis voltage, a voltage drop corresponding to the equivalent leakage inductance occurs during the current instruction change and, thereafter, the exponential attenuation corresponding to the time constant $\tau_2$ occurs.

These relationships are as follows:

$$E_{1d0}=V_{1d}-R_1 \cdot I_{1d}$$

$$E_{1q0}=V_{1q},$$

$$(L_\sigma)=(E_{1q}-E_{2q})/(I_{1d}\cdot\omega_1)$$

$$(M')_d=E_{2q}/(I_{1d}\cdot\omega_1)\ldots \quad (22)$$

The zero current control is such that, with the power converting block 2 connected with the induction motor 1, the voltage output having the same voltage output with the induced voltage of the induction motor 1 is derived from the power converting block 2 so that the potential difference is made zero to obtain the zero current. If the output voltage of the power converting block 2 or the output voltage of the current control system 3A is measured, it means that the speed electromotive force is measured.

(3) Transient Torque Current Test

In a case where the load torque can be measured, the constant adjustment of the q axis leakage reactance related to the torque current can be made with respect to the torque. However, in a case where a readjustment is needed at the motor mounted in an actual installation site and/or in a case where a simple adjustment is desired to be made with the torque accuracy not needed so as to be high, it is convenient to enable adjustment with the main body of the induction motor 1 only as a single specimen to be tested.

It is noted, however, that the torque current is not present under the no-load driving so that the q axis component cannot be measured.

There is a method of adjusting the secondary resistance $R_2$ utilizing the torque such as to accelerate an inertia moment of the induction motor itself by an acceleration/deceleration driving condition. At the time when the speed is abruptly changed, the slip error between the stator and rotor is easy to occur so that the axis deviation of the magnetic flux can occur. Therefore, the accurate measurement of the secondary circuit resistance cannot be made.

In addition, it is necessary to provide the constants which can calculate the induction motor voltages during the lead driving condition in order to compensate for the secondary resistance compensation. However, if the axis deviation on the magnetic flux during the acceleration/deceleration driving is present, this constants cannot accurately be measured.

As the constant measuring method in which only the main body of the induction motor 1 is tested, the other control condition which establishes the magnetic flux and torque current without no adjustment of the secondary resistance.

In the same way as the adjustment of the secondary interlinkage magnetic flux, the measurement under the less secondary magnetic flux at the time of transient state provided that the response of the current control system (ACR) is sufficiently speedy with the time constant of the secondary magnetic flux taken into consideration.

During the no-lead driving condition (slip≈0), the magnetic flux is approximately proportional to the excitation current $1_{1d}$ without receipt of the variation in the secondary resistance $R_2$. Hence, if the torque current is changed in the stepwise manner after the motor falls into the steady state after the no-lead driving upon the excitation current instruction as the result of adjustment by the speed electromotive force $E_1$ described above, the secondary magnetic flux and torque current can simultaneously be controlled immediately after the change in the torque current in the stepwise manner.

Figure 16:
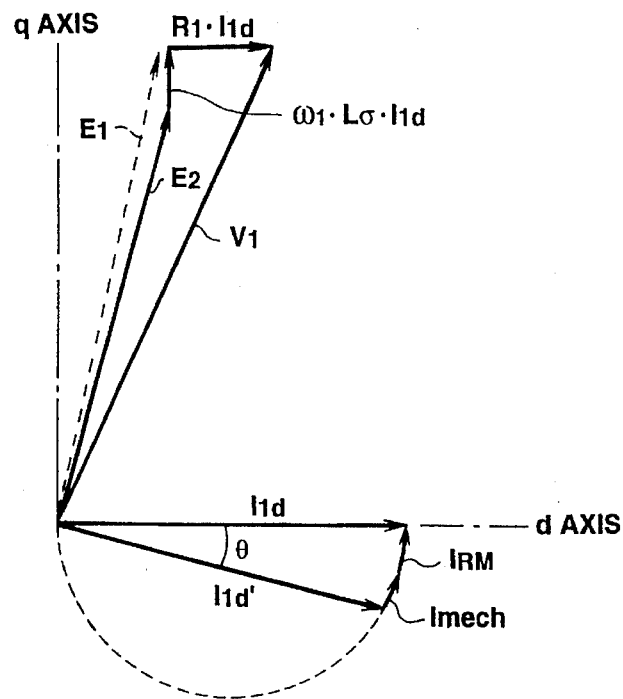
FIG. 16 is an explanatory view for explaining a relationship between an iron loss current and axial deviation due to a mechanical loss.

Then, the problem is such that since, as shown in FIG. 16, the iron loss current and mechanical loss current are present under the no-load driving condition, the axis deviation corresponding to the phase θ between the primary current $I_{1d}$ and magnetic flux is present as shown in FIG. 16.

If this axis deviation cannot sufficiently be compensated, the torque current component which is orthogonal to the magnetic flux cannot be set. If the voltage detection is accurate, the magnetic flux can be determined from the voltage phase during the issuance of zero current instruction (zero current test). However, since the error component in a dead time appears as the phase error, the phase data is not so accurate.

Figure 17:
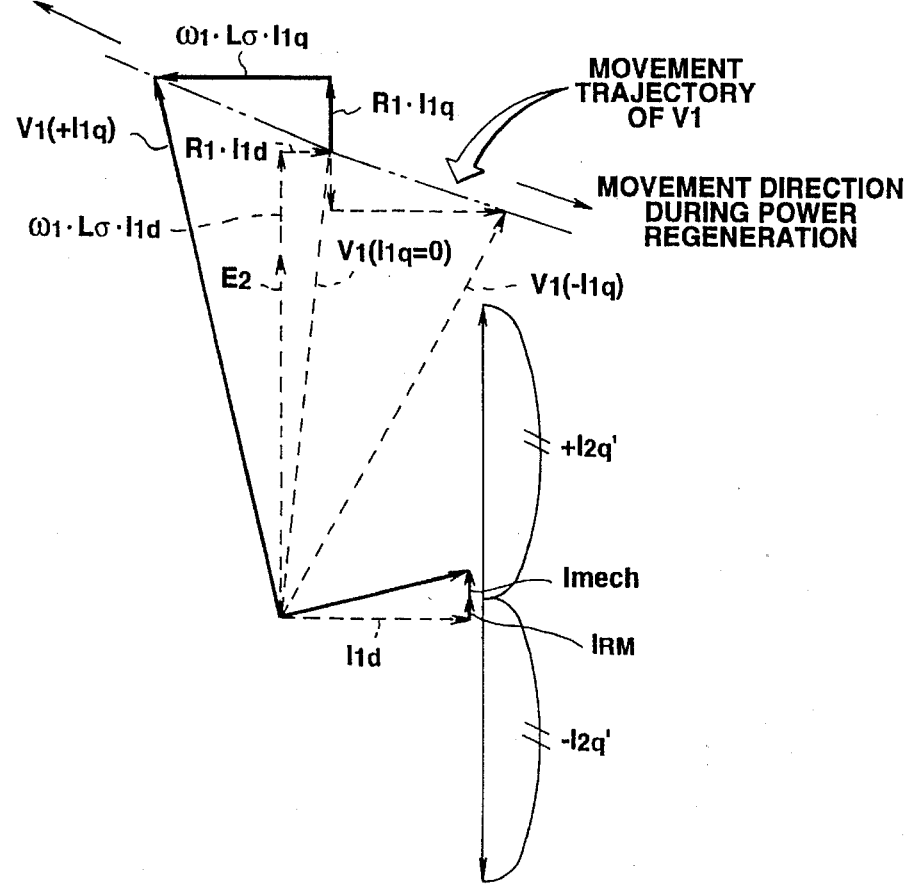
FIG. 17 is an explanatory view for explaining an impedance calculation.

Hence, as shown in FIGS. 11 and 17, for an iron loss compensating block 15A, the torque current (i.e., a mechanical loss current $I_{mech}$) during the no-load driving is inversely calculated according to the slip frequency, excitation current $i_{1d}$, secondary time constant derived at the initial setting or zero current measurement so as to measure the mechanical loss during the no-load driving. The slip frequency used at this time is derived from the slip when the speed control system 4A outputs a less magnitude of the torque instruction during the no-load driving condition.

As described above, the instructions of the torque current components of the rated current ($+I_{2q}'$ and $-I_{2q}'$) For the motor are given in the stepwise manner to the current control system 3A from the torque current instruction block 5A after the no-load driving of the motor 1 through the speed control system (ASR) 4A becomes stable. It is noted that the mechanical loss current $I_{mech}$ is included in $I_{w1}'$ but is not included in the iron loss current $I_{RM}$, as shown in FIG. 19A.

FIG. 17 shows the vector diagram in the state described above.

The rate of change in terminal voltages $V_{1q}$ and $V_{1d}$ of the motor 1 when the torque current is changed corresponds to the voltage drop component due to the primary resistance $R_1$ on the q axis component by means of the torque current and the equivalent leakage inductance $L_\sigma$. A change width of the torque current and variation width of the voltage at this time are detected so that the torque components $(R_1)_q$ of the primary resistance for compensation of the secondary resistance $R_2$ and that $(L_\sigma)_q$ of the equivalent leakage inductance are derived by an impedance calculating block 16A shown in FIG. 11.

$$(R_1)_q = \Delta V_{1q}/(2 \cdot I_{2q}'), \text{ and}$$

$$((L_\sigma)_q = -\Delta V_{1d}/(2 \cdot I_{2q}') \ldots \ldots \quad (22)$$

The voltage components at this time are derived when the magnetic flux and the torque current are generated in accordance with the designed values. In a case where the compensation for the secondary resistance $R_2$ is carried out, both magnetic flux and torque current are established if the voltage for the compensation of the secondary resistance is converged into a target value.

Figure 18:
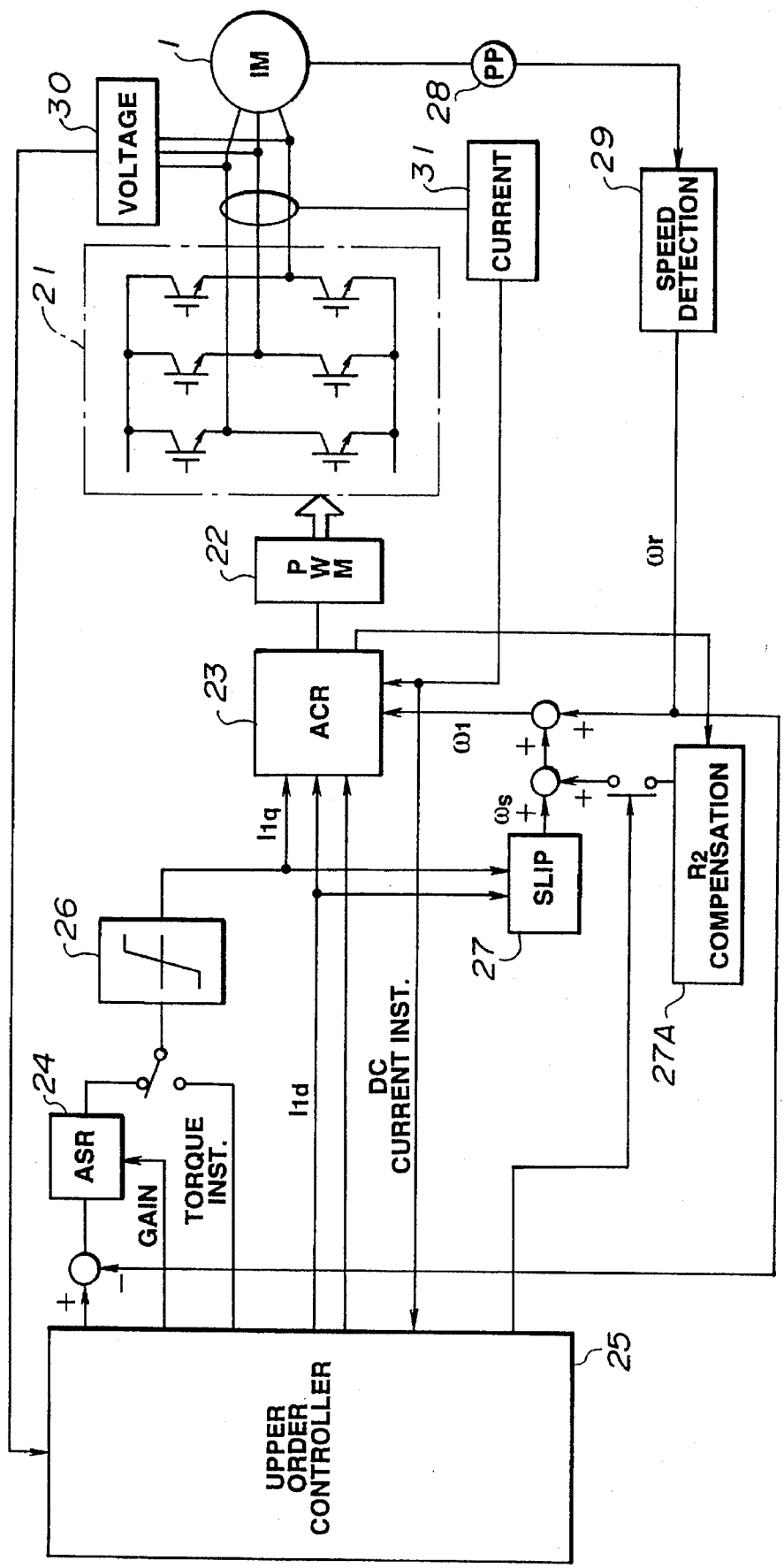
FIG. 18 is a detailed circuit block diagram of the motor constant measuring apparatus in the second embodiment shown in FIG. 11.

FIG. 18 shows a circuit block diagram of the motor constant measuring apparatus in the second embodiment.

In the second embodiment shown in FIG. 18, an inverter main circuit 21 which supplies the alternating voltage under the vector control to the induction motor 1 is provided with main switching elements of IGBTs (Insulated Gate Bipolar Transistors) which are capable of increasing carrier Frequencies. The main switching elements may be other transistors, GTO (Gate Turn Off thyristors), or FETs (Field Effect Transistors).

Gate controls on main switches of the inverter main circuit 21 are carried out by the PWM waveform generator 22. The current control system (ACR) 23 carries out the phase control and frequency control of the output voltages of the PWM waveform generator 22.

The torque current instruction $I_{1q}$ to the current control system 23 is given thereto via a switching of the torque instruction output of the speed control system (ASR) 24 or of an upper order controller 25 and via a limiter 26.

The excitation current instruction $I_{1d}$ to the current control system 23 is given from the upper order controller 25.

These current instructions are fetched into the slip calculating block 276.

The slip angular frequency $\omega_s$ as the result of slip calculation by the slip calculating block 276 and the rotor angular frequency $\omega_r$ of the motor 1 are added to provide the primary frequency $\omega_1$ to the current control system 23. The slip calculation uses the set secondary resistance $R_2$ and this compensation is carried out by a secondary resistance compensation block 27A.

The speed detection of the induction motor 1 is converted into the speed signal by means of the speed calculating block 29 according to the detected output of the rotating phase of a pulse encoder 28.

A voltage detecting block 30 serves to detect the voltage supplied to the induction motor 1 from the inverter main circuit 21 or the induced voltage of the induction motor 1. The output current from the inverter main circuit 21 is detected by a current detection block 31.

In the second embodiment, the motor constants are measured by utilizing the vector control system shown in FIG. 18. Generations and calculations of various instructions are carried out with a software element in the upper order controller 25.

The instructions issued from the upper order controller 25 include the speed instructions to the speed control system (ASR) 24 required for the vector control, excitation current instruction, and the torque current instruction. In addition, the upper order controller 25 serves as the excitation current instruction generating block 6A and the DC current instruction block 7A shown in FIG. 11.

Furthermore, the upper order controller 25 has the software structure having the calculation function of the voltage detection block 9A shown in FIG. 11 and functions of the respective calculation, adjustment, and compensation shown in brackets enclosed by a broken line of FIG. 11.

Although, in the measurements of the primary resistance R1 and the offset voltage by means of the above-described DC current test described in the item (1) from among the constant measurement in the second embodiment, the two types of data are obtained as the primary resistance for the respective axes according to the current polarities. In the second embodiment, an average value of three-phase six derived primary resistances is calculated as the primary resistance measured value.

In addition, the voltage detection offset components are thereafter used as the offset correction data at the subsequent voltage detection so that the higher measured constant accuracy can be achieved.

Figure 19:
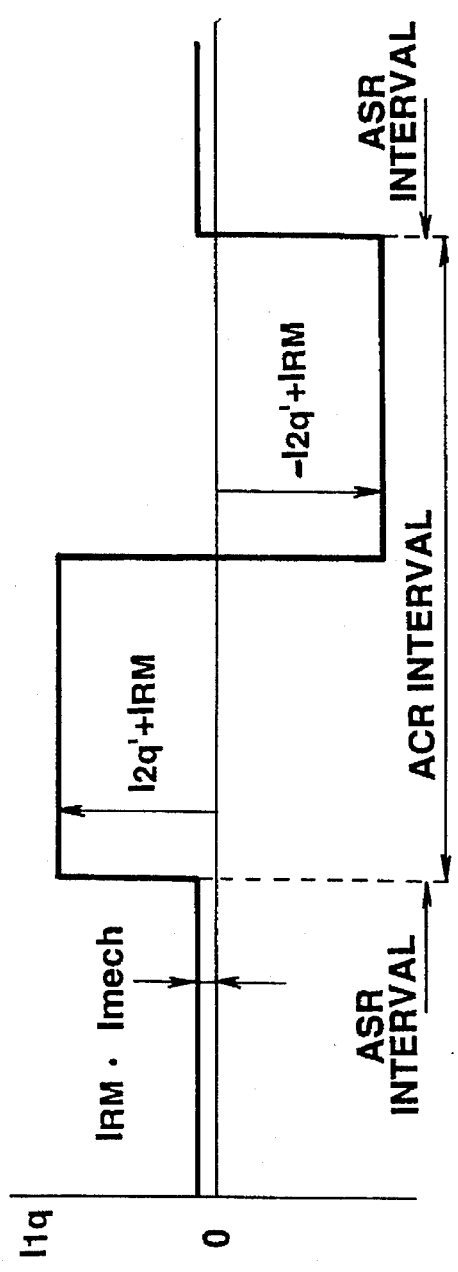
FIGS. 19A through 19C are waveform charts of the primary voltage in the d and q axes during a transient torque current testing in the second embodiment shown in FIG. 18.
Figure 19:
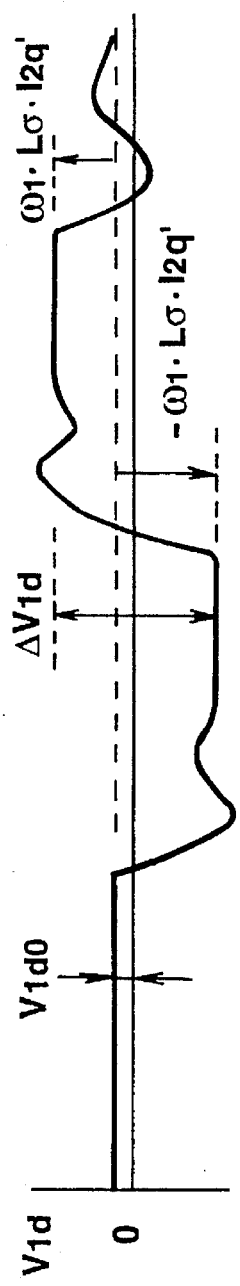
Figure 19:
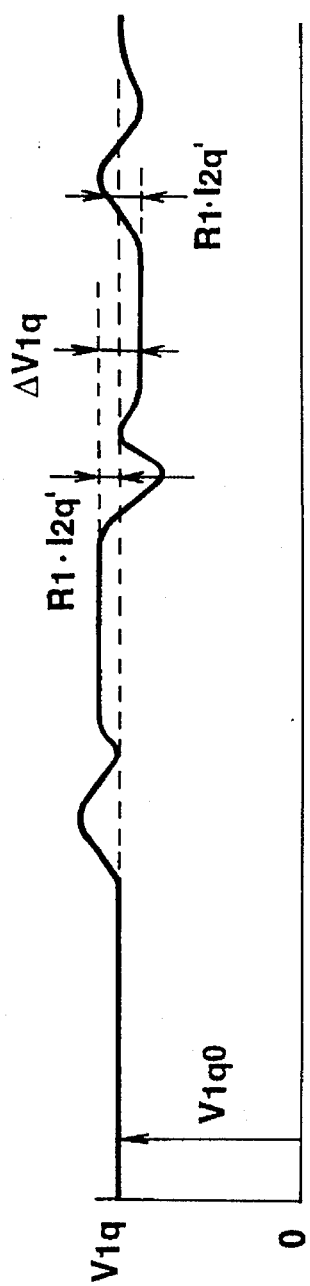

In the case of the impedance measurement by means of the above-described transient torque current test of the item (3), the switching between the speed control and torque control is such as to return to the speed control (ASR interval) after the measurement by the torque control (ACR interval) as shown in FIGS. 19 A through 19 C. This reason of switching is that the error occurs in the slip when the error is present in the secondary circuit time constant at the initial stage of testing, thereby bringing out the axis deviation on the magnetic flux. Therefore, immediately after the output voltage is converged and measured, control is returned to the speed control so that the magnetic flux is waited to be returned to the original.

Furthermore, with the detection in voltage errors due to the disturbances into the control such as the dead time in the inverter 21 taken into consideration, a plurality of number of times the measurements are carried out so that a deletion of an abnormal data and averaging are carried out to improve the measurement accuracy.

In addition, the vector control is established even if a temperature variation of $R_2$ is present by turning on the compensation input of the secondary resistance compensation block 27A by means of the upper order controller 25 after the impedance measurement is made, for an on-line compensation for the secondary resistance $R_2$.

Next, effects achieved by the present invention will be described for each item.

(1) In the First Embodiment (1—1) Since the rapid change in the current instruction to zero causes occurrence in the commutation phenomenon so as to generate the secondary current, the accurate secondary current can be generated even at higher frequency. In addition, since the speed electromotive force component becomes accordingly larger at the higher frequency, the voltage detection error becomes less and a highly accurate measurement of the motor constants can be achieved.

(1–2) Since the output current can be maintained to zero with the current instruction being zeroed, the voltage equal to the induced electromotive force of the induction motor can be generated as the output of the current control system.

Thereby, by measuring the output voltage from the current control system, the measured value equivalent to the terminal voltage of the induction motor can be obtained. That it to say, an external measuring instrument as a voltage meter is not necessary. The speed variable apparatus for the induction motor itself can measure the motor constants.

(1–3) Since the attenuation phenomenon of the secondary circuit is utilized, the frequency component of the magnetic flux change can be deemed to be approximate to the secondary circuit time constant. Hence, since the skin effect affecting the leakage inductance component $L_\sigma$ can be measured under the condition approximated to the actual driving condition, thus enabling the increase in the measurement accuracy.

(1–4) Since the highly accurate measurement of the motor constants with least possible installation of measuring means in the speed variable apparatus can be achieved, (a) the motor constants can be measured for the respective induction motors having deviations (variances) generated in the manufacturing process and the most appropriate driving of the motor can be achieved; (b) a manual adjustment becomes unnecessary and the deletion of the adjustment labor hour can become possible; (c) the optimum constant setting for an induction machine in which the constants are unknown such as an already industrially applied induction machine can be achieved; and (d) an abnormally operated induction machine can be determined by searching for variations in the motor constants when a regular measurement for maintenance purpose is carried out.

(2) In the Second Embodiment (2–1) The motor constants can be measured in the no-load driving condition without connection of a load device to the induction motor under the vector control.

(2—2) Since no control error due to inconsistency of the voltage and current detection gains between the measuring instrument and vector control apparatus since the circuit constants of the motor are measured with the control apparatus itself under the vector control.

(2–3) Since the adjustment of the circuit constants is carried out under such a condition that the influence of the primary resistance as the current being zero is not received and the voltage of the secondary magnetic flux can directly be measured, the magnetic flux adjustment accuracy is high. In addition, since the magnetic flux is measured at the magnetic saturation state approximated to the actual driving condition, the result of the measurement with the magnetic saturation taken into consideration can be achieved.

(2–4) Since the result of magnetic flux adjustment is derived in the form of the excitation current, the calculation becomes necessary although the excitation current has conventionally calculated from the magnetic flux instruction and excitation inductance.

(2–5) Since the magnetic flux is controlled under the condition of the no load such that the variation in the secondary resistance is not received, the circuit constants with a preferable magnetic flux accuracy can be obtained.

(2–6) Since the magnetic flux is easier to be saturated, in the strict sense of the word, the difference in the inductance between the d axis and q axis occurs for the equivalent circuit constants. In the second embodiment, it is possible to carry out the constant measurement with the leakage inductances due to the individual current components of the d axis and 1 axis separated. The improvement in the accuracy can be achieved by using the impedances divided into the d axis and q axis when using the secondary resistance compensation It will fully be appreciated by those skilled in the art that the foregoing description is made in terms of the preferred embodiment and various changes and modifications may be made without departing from the scope of the present invention which is to be defined by the appended claims.

What is claimed is:

1. An apparatus for an induction motor, comprising:
   a) power inverting means for supplying a desired vector controlled alternating current to said induction motor;
   b) current control means for controlling the alternating current supplied from said power inverting means to said induction motor in a vector control mode;
   c) detecting means for detecting at least one of output and input parameters of said induction motor which is driven under a predetermined driving condition according to the vector controlled alternating current;
   d) calculating means for calculating at least one desired motor constant of said induction motor in a predetermined equivalent circuit thereof on the basis of the detected parameter, said current control means controlling the alternating current in the vector control mode using the calculated motor constant; and
   e) current instruction changing means for changing levels of excitation and torque current instructions ($I_{1d*}$, $I_{q1*}$) supplied to said current control means to a value of zero in a stepwise manner.

2. An apparatus for an induction motor, comprising:
   a) power inverting means for supplying a desired vector controlled alternating current to said induction motor;
   b) current control means for controlling the alternating current supplied from said power inverting means to said induction motor in a vector control mode;
   c) detecting means for detecting at least one of output and input parameters of said induction motor which is driven under a predetermined driving condition according to the vector controlled alternating current;
   d) calculating means for calculating at least one desired motor constant of said induction motor in a predetermined equivalent circuit thereof on the basis of the detected parameter, said current control means controlling the alternating current in the vector control mode using the calculated motor constant; and
   e) current instruction changing means for changing levels of excitation and torque current instructions ($I_{1d*}$, $I_{q1*}$) supplied to said current control means to a value of zero in a stepwise manner,
   wherein said detecting means comprises:
   1) first detecting and storing means for detecting excitation current control d-axis side and torque current control q-axis side voltage components ($V_{1d*}$)$_{-0}$, ($V_{1q*}$)$_{-0}$ of a primary circuit voltage of said induction motor, current components (Id, Iq) of a primary circuit current, and a primary circuit frequency $\omega_1$ supplied to said induction motor before said current instruction changing means changes the current instructions in the stepwise manner to a value of zero and for storing the detected values therein, said induction motor being driven under a steady-state driving condition with a load device connected to an output axle of said induction motor; and
   2) sampling and storing means for sampling the components of the primary circuit voltage ($V_{1d*}$, $V_{1q*}$), the primary circuit current ($I_{1d}$, $I_{1q}$), and the primary circuit frequency $\omega_1$ of the induction motor after said current instruction changing means has changed the current instructions in the stepwise manner to a value of zero and storing the sampled data of the components therein.

3. An apparatus for an induction motor as set forth in claim 2, wherein said calculating means calculates a secondary circuit time constant on the basis of the following equations;

$$\tau_2 \approx \tau_{w1}{}^* \text{ and } V_{1q}{}^*(t)=(V_{1q}{}^*)_{+0}\cdot\exp(-(1/\tau 2q^*)\cdot t)$$

wherein $(V_{1q}{}^*)_{+0}$ denotes a control q-axis primary voltage component, immediately after said current instruction changing means has changed the current instructions in a stepwise manner to a value of zero, measured and stored in said sampling and storing means, and output from said current control means, $v_{1q}{}^*(t)$ denotes a time function of $V_{1q}{}^*$ after the current instruction changing means has changed the current instructions in the stepwise manner to a value of zero.

4. An apparatus for an induction motor as set forth in claim 3, wherein said calculating means further calculates an axial deviation error phase angle $\Delta\phi$ on the basis of the detected output parameter, said axial deviation phase error angle being calculated as follows:

$$\Delta\phi=(\phi_{v^*})_{+0}-\theta_a-90°, \text{ wherein}$$

$(\phi_{v^*})_{+0}=\tan^{-1}\{(V_{1q^*})_{+0}/(V_{1d^*})_{+0}\}$, $\theta_a=\tan^{-1}(\tau_2\cdot\omega_1)$, wherein $\tau_2 \approx \tau_{2q^*}$.

5. An apparatus for an induction motor as set forth in claim 4, wherein said calculating means further calculates an excitation inductance M' and leakage inductance $L_\sigma$ in a first T-I shaped equivalent circuit of the induction motor on the basis of the following equations:

$$M'=|E_2|/\{\omega_1\cdot|(i_1)_{-0}|\cdot\cos(\phi_i-\Delta\phi)$$

$$L_\sigma=\Delta V_1\delta/\{\omega_1\cdot|(i_1)_{-0}|\}$$

wherein $$|E_2|=\{(V_{1d^*})_{+0}{}^2+(V_{1q^*})_{+0}{}^2\}^{1/2}\cdot\cos(\theta_a)$$

$$|(i_1)_{-0}|=(i_0)_{+0}/\cos(\phi_i-\Delta\phi^*), \phi_i=\tan^{-1}I_d/I_q$$

$$\Delta V_1\delta=|(V_1)_{-0}|\cdot\sin\{(\phi_{v^*})_{-0}-(\phi_{i^*})_{-0}-|E_2|\sin\{(\phi_{v^*})_{-0}-(\phi_{i^*})_{-0},\}$$

wherein $(I_0)_{+0}$ denotes an excitation current component orthogonal to an amplitude component $|E_2|$ of a speed electromotive force component $E_2$ corresponding to $$(V_{1q})_{+0}, (\phi_{i^*})_{-0}=\tan^{-1}\{(I_{1q^*})/(I_{1d^*})\}, (V_1)_{-0}$$

being a synthesis of the d-axis and q-axis voltage components $(V_{1d})$ and $(V_{1q})$.

6. An apparatus for an induction motor as set forth in claim 1, which further comprises:

a) speed control means for providing a torque current instruction of a rated value for the induction motor for said current control means, a magnitude of said torque current instruction being changed in a stepwise manner as plus $I_{2q}{}'$ and a minus $I_{2q}{}'$ and serving to control the induction motor such that an output axle of said induction motor driving under a no-lead driving condition and which rotates at a constant revolution speed;

b) excitation current instruction providing means for providing a specified excitation instruction for said current control means; and c) deriving means for deriving a slip frequency $\omega_s$ of the induction motor, deriving an angular frequency $\omega_1$ of the alternating current supplied to said induction motor on the basis of said slip frequency, and wherein said output parameter detecting means includes: terminal voltage detecting means for detecting a terminal voltage across said induction motor and dividing the terminal voltage into voltage components of a d axis $V_{1d}$ and q axis $V_{1q}$ when said speed control means provides said torque current instruction for said current control means in the stepwise manner; and output axle rotation angular velocity detecting means for detecting an output axle rotation angular velocity $\omega_r$, and wherein said calculating means calculates a variation width of said torque current instruction having the magnitude of $-I_{2q}$ with respect to zero and a variation width $\Delta V_{1d}$ of said voltage component in the d axis and calculates an equivalent leakage inductance torque component $(L_\sigma)_q$ on the basis of said variation width of $I_{2q}{}'$, variation width $\Delta V_{1d}$ of said voltage component in the d axis, and said angular frequency $\omega_1$ of the alternating current supplied to said induction motor.

7. An apparatus for an induction motor as set forth in claim 6, wherein $$(L_\sigma)_q=-\Delta V_{1d}/(2\cdot I_{2q}{}'\cdot\omega_1).$$

8. An apparatus for an induction motor as set forth in claim 7, wherein said calculating means further calculates a primary circuit resistance torque component $(R_1)_q$ for compensating a secondary circuit resistance $(R_2)_q$ on the basis of the variation width $\Delta V_{1q}$ of the voltage component in the q axis and the magnitude of $+I_{2q}{}'$ with respect to zero.

9. An apparatus for an induction motor as set forth in claim 8, wherein $$((R_1)_q=\Delta V_{1q}/(2\cdot I_{2q}{}').$$

10. An apparatus for an induction motor as set forth in claim 9, wherein the motor constants of $(R_1)_q$ and $(L_\sigma)_q$ are connected to an equivalent circuit leakage inductance M', which is parallel to an iron loss resistance $(R_m)$ and a secondary resistance $(R_2')$.

11. A method for measuring at least one desired motor constant in an established equivalent circuit of an induction motor using a vector control system comprising the steps of:

a) supplying a desired vector controlled alternating current to said induction motor, said induction motor being driven in a predetermined driving condition;

b) controlling the alternating current supplied at said step a) from power inverting means connected to said induction motor and supplied thereto in a vector control mode;

c) detecting at least one of output and input parameters of said induction motor which is driven under a predetermined driving condition according to the vector controlled alternating current supplied to said induction motor;

d) calculating the desired motor constant of said induction motor in the established equivalent circuit thereof on the basis of the detected parameter, said step b) controlling the alternating current supplied to said induction motor via said power inverting means in the vector control mode using the calculated motor constant; and e) changing at least one of a torque current instruction value or an excitation current instruction value supplied to said step b) from its rated value in a negative going pulse form so that a transient phenomenon of the induction motor is utilized to calculate the desired motor constant, said induction motor being driven in a steady-state driving condition or in a no-load constant speed driving condition.

\* \* \* \* \*